US011118267B2

(12) United States Patent
Kato et al.

(10) Patent No.: US 11,118,267 B2
(45) Date of Patent: Sep. 14, 2021

(54) SUBSTRATE PROCESSING METHOD

(71) Applicant: TOKYO ELECTRON LIMITED, Tokyo (JP)

(72) Inventors: Hitoshi Kato, Oshu (JP); Toshiyuki Nakatsubo, Oshu (JP); Takeshi Kobayashi, Oshu (JP); Tomoya Hasegawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 22 days.

(21) Appl. No.: 16/416,609

(22) Filed: May 20, 2019

(65) Prior Publication Data

US 2019/0360093 A1 Nov. 28, 2019

(30) Foreign Application Priority Data

May 22, 2018 (JP) .............................. JP2018-097857

(51) Int. Cl.
*C23C 16/458* (2006.01)
*C23C 16/455* (2006.01)

(52) U.S. Cl.
CPC .... *C23C 16/4584* (2013.01); *C23C 16/45544* (2013.01)

(58) Field of Classification Search
CPC ....................... C23C 16/4584; C23C 16/45544
See application file for complete search history.

(56) References Cited

U.S. PATENT DOCUMENTS 5,704,493 A * 1/1998 Fujikawa .......... H01L 21/67313
118/500
6,858,088 B1 * 2/2005 Dress ...................... B05C 11/08
118/50

(Continued)

FOREIGN PATENT DOCUMENTS

EP 1176628 A2 * 1/2002 ............. H01L 21/00
JP 10-12709 * 1/1998 ............. H01L 21/68

(Continued)

OTHER PUBLICATIONS

Zoller, Alfons, "Direct optical monitoring on the rotating substrate holder". Vakuum in Forschung und Praxis, Vacuum's Best, vol. 20, Issue S1, Apr. 2008, pp. 21-25. Abstract Only https://doi.org/10.1002/vipr.200890035.*

*Primary Examiner* — Bret P Chen
(74) *Attorney, Agent, or Firm* — Nath, Goldberg & Meyer; Jerald L. Meyer; Tanya E. Harkins

(57) ABSTRACT

A method of processing a substrate, includes: mounting at least one substrate on at least one substrate holder configured to rotate about an axis of the at least one substrate holder, the at least one substrate holder being provided along a circumferential direction of a rotary table installed inside a processing chamber; holding the at least one substrate by the at least one substrate holder in a contact manner by bringing a substrate contact portion into contact with at least three points on a lateral surface of the at least one substrate mounted on the at least one substrate holder; and performing a substrate process while rotating the rotary table and rotating the at least one substrate holder about the axis of the at least one substrate holder in a state where the at least one substrate is held by the at least one substrate holder in the contact manner.

8 Claims, 12 Drawing Sheets

(56) References Cited

U.S. PATENT DOCUMENTS

| | | | |
|---|---|---|---|
| 9,711,388 B2* | 7/2017 | Reichart | C23C 16/50 |
| 2002/0000371 A1* | 1/2002 | Mishima | H01L 21/67778 |
| | | | 204/199 |
| 2002/0172585 A1* | 11/2002 | Graf | H01L 21/68 |
| | | | 414/757 |
| 2005/0265814 A1* | 12/2005 | Coady | H01L 21/68 |
| | | | 414/744.5 |
| 2007/0286967 A1* | 12/2007 | Ide | H01J 37/32422 |
| | | | 427/569 |
| 2009/0175705 A1* | 7/2009 | Nakao | H01L 21/67098 |
| | | | 414/196 |
| 2011/0303527 A1* | 12/2011 | Hosoya | C23C 14/352 |
| | | | 204/192.15 |
| 2012/0148375 A1* | 6/2012 | Tashiro | H01L 21/67173 |
| | | | 414/217 |
| 2012/0224945 A1* | 9/2012 | Douki | H01L 21/68 |
| | | | 414/758 |
| 2014/0174351 A1* | 6/2014 | Aikawa | C23C 16/45551 |
| | | | 118/713 |
| 2015/0255258 A1* | 9/2015 | Nozawa | H01J 37/32779 |
| | | | 156/345.42 |
| 2015/0294893 A1* | 10/2015 | Reichart | H01L 21/02271 |
| | | | 438/758 |
| 2016/0322248 A1* | 11/2016 | Fukushima | H01L 21/68 |
| 2017/0009345 A1* | 1/2017 | Kato | C23C 16/46 |
| 2017/0225906 A1* | 8/2017 | Masuda | B65G 47/848 |
| 2018/0245218 A1* | 8/2018 | Kato | H01J 37/32798 |
| 2018/0266007 A1* | 9/2018 | Hill | C25D 17/001 |

FOREIGN PATENT DOCUMENTS

| | | | | |
|---|---|---|---|---|
| JP | 2009-54964 | * | 3/2009 | H01L 21/677 |
| JP | 2013-21362 | * | 1/2013 | H01L 21/677 |
| JP | 2016-152264 A | | 8/2016 | |
| JP | 2017-139449 A | | 8/2017 | |
| WO | WO 2005/053016 A1 * | | 11/2004 | H01L 21/68 |
| WO | WO 2015/093035 A1 * | | 6/2015 | H01L 21/68 |
| WO | WO 2016/154539 A1 * | | 9/2016 | G11B 7/08 |
| WO | WO 2018/226198 A1 * | | 12/2018 | H01L 21/68 |

* cited by examiner

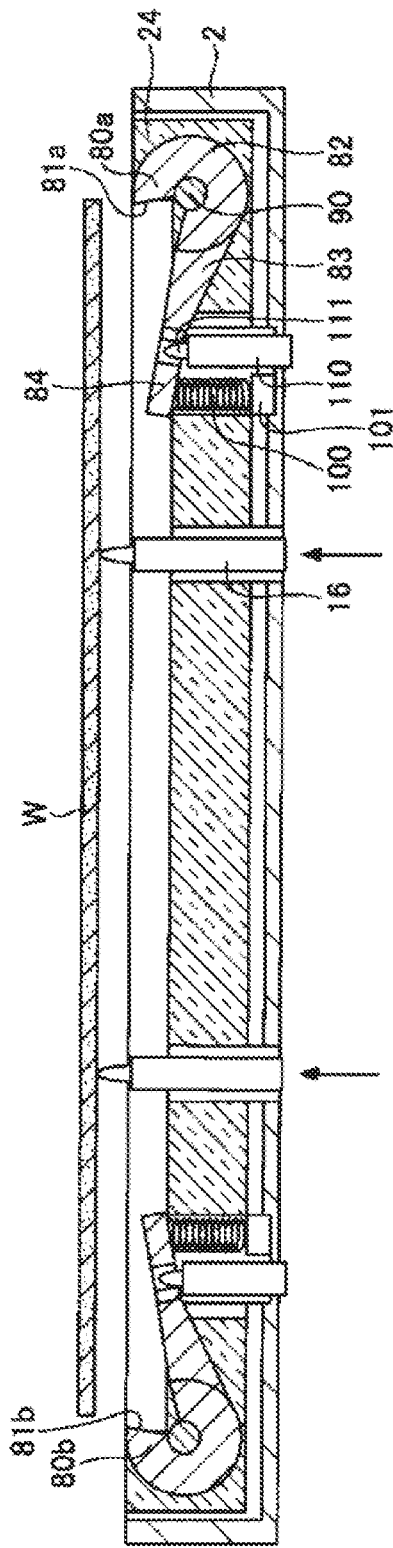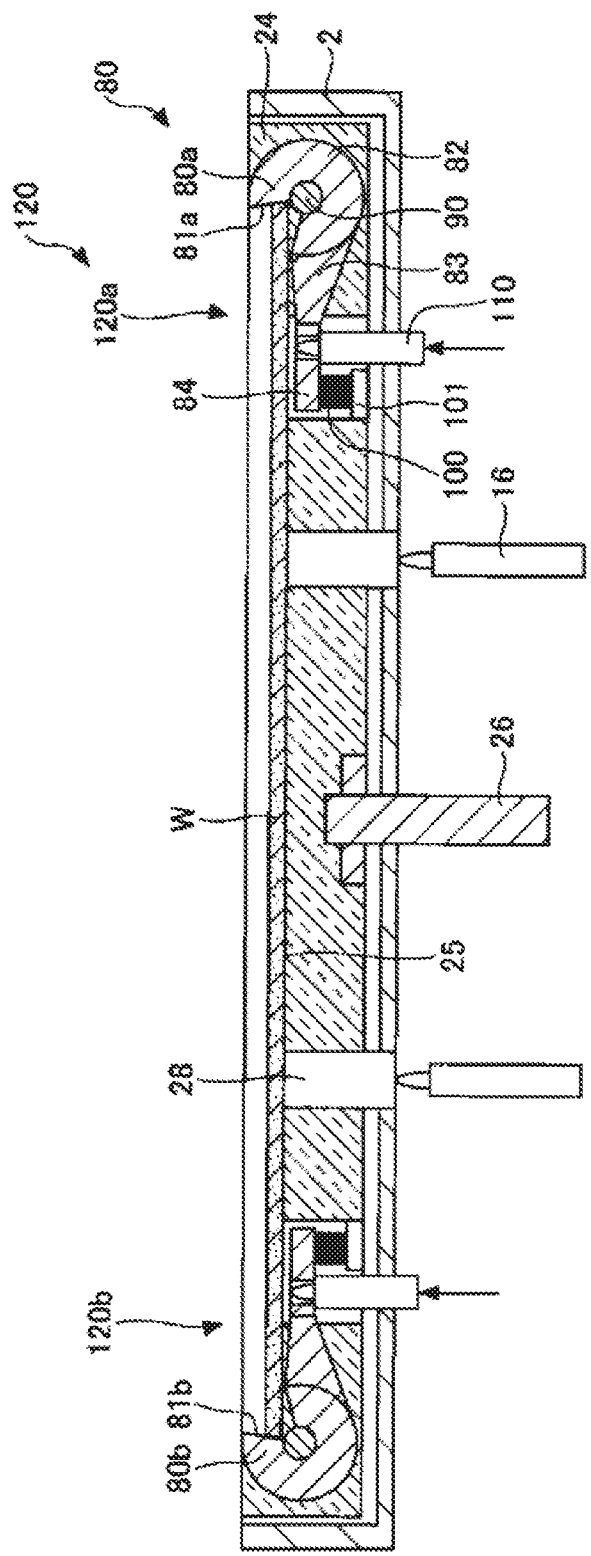

FIG. 15
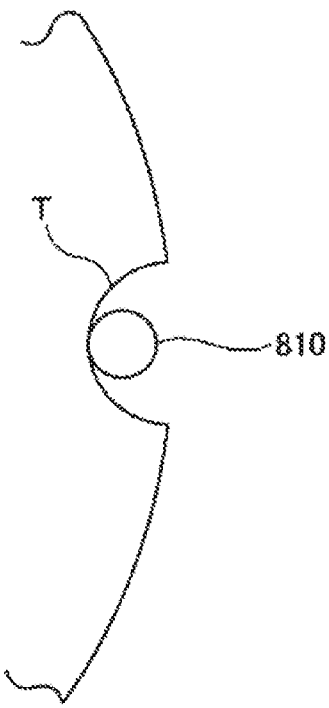
FIG. 16A        FIG. 16B
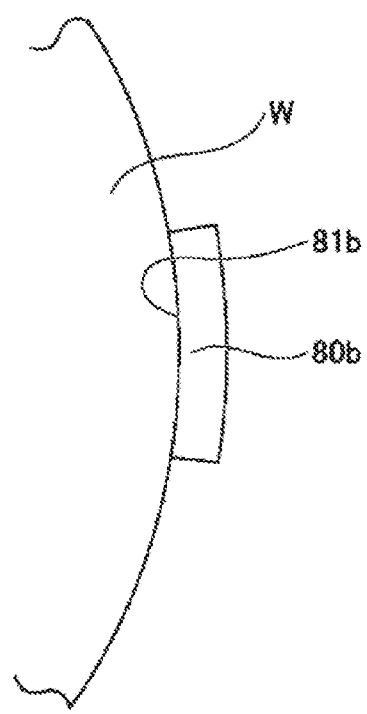   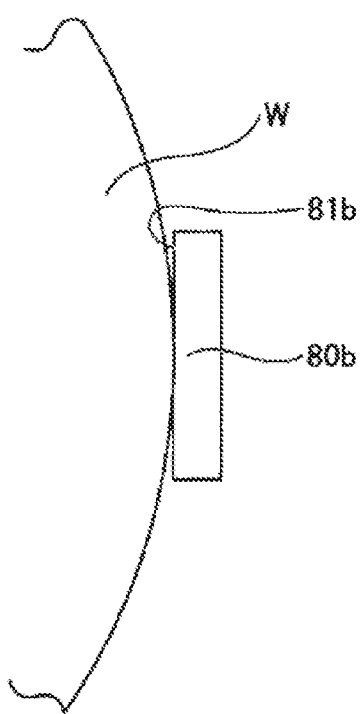

SUBSTRATE PROCESSING METHOD

CROSS-REFERENCE TO RELATED APPLICATION

This application is based upon and claims the benefit of priority from Japanese Patent Application No. 2018-097857, filed on May 22, 2018, the entire contents of which are incorporated herein by reference.

TECHNICAL FIELD

The present disclosure relates to a substrate processing method and a substrate processing apparatus.

BACKGROUND

In the related art, there is known a substrate processing apparatus for performing a process by supplying a processing gas to a substrate while revolving the substrate mounted on a rotary table provided in a processing container. In such a substrate processing apparatus, a mounting table on which the substrate is mounted is provided to rotate around a rotational axis extending in a direction along a rotary shaft of the rotary table. The rotary table is also rotated while rotating the mounting table around the rotational axis (for example, see Patent Document 1).

In addition, there is also known a substrate processing apparatus in which only a rotary table is rotated and a rotation mechanism for rotating a substrate holding region in which a substrate is held is not provided. This substrate processing apparatus includes a substrate holding mechanism for preventing the substrate from floating (for example, see Patent Document 2).

PRIOR ART DOCUMENTS

Patent Documents

Patent Document 1: Japanese laid-open publication No. 2017-139449
Patent Document 1: Japanese laid-open publication No. 2016-152264

SUMMARY

Some embodiments of the present disclosure provide a substrate processing method and a substrate processing apparatus which are capable of preventing misalignment of a substrate inside a substrate holder when performing a substrate process using the substrate processing apparatus that includes one rotation mechanism for rotating the substrate holder about its own axis and another rotation mechanism for rotating a rotary table.

According to an embodiment of the present disclosure, there is provided a method of processing a substrate, including: mounting at least one substrate on at least one substrate holder configured to rotate about an axis of the at least one substrate holder, the at least one substrate holder being provided along a circumferential direction of a rotary table installed inside a processing chamber; holding the at least one substrate by the at least one substrate holder in a contact manner by bringing a substrate contact portion into contact with at least three points on a lateral surface of the at least one substrate mounted on the at least one substrate holder; and performing a substrate process while rotating the rotary table and rotating the at least one substrate holder about the axis of the at least one substrate holder in a state where the at least one substrate is held by the at least one substrate holder in the contact manner.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 14A and 14B are sectional views for explaining a detailed structure and operation of the example of the misalignment prevention mechanism in the substrate processing apparatus according to the embodiment of the present disclosure.

FIG. 15 is a view showing an example of a planar shape of a notch contact member.

FIGS. 16A and 16B are views showing an example of a planar shape of an outer periphery deviation prevention member.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

A film forming apparatus 1 for performing a film forming process on a wafer W as a substrate using an ALD (Atomic Layer Deposition) method will be described as a substrate processing apparatus according to one embodiment of the present disclosure. The substrate processing apparatus according to the present embodiment can be applied to a wide variety of apparatuses as long as they include a rotatable susceptor, namely a rotary table type susceptor, and have a configuration in which a substrate holder provided on an upper surface of the susceptor can be rotated about its own axis. In the present embodiment, an example in which the substrate processing apparatus is configured as an ALD-based film forming apparatus will be described.

The type of a film formed by the ALD-based film forming apparatus is not particularly limited so long as it is not limited thereto, but the present disclosure is applicable to all films that can be formed. In the present embodiment, there will be described an example in which a process of allowing a BTBAS (bis-tertiarybutylaminosilane) gas as a raw material gas containing Si (silicon) to be adsorbed onto the wafer W, a process of supplying an ozone ($O_3$) gas as an oxidizing gas for oxidizing the BTBAS gas to form a molecular layer of $SiO_2$ (silicon oxide), and a process of exposing the molecular layer to plasma generated from a plasma generating gas to modify the molecular layer. In this example, the aforementioned processes are repeated multiple times to form a $SiO_2$ film. The raw material gas, the oxidizing gas and the plasma generating gas correspond to processing gases of the present embodiment.

Figure 1:
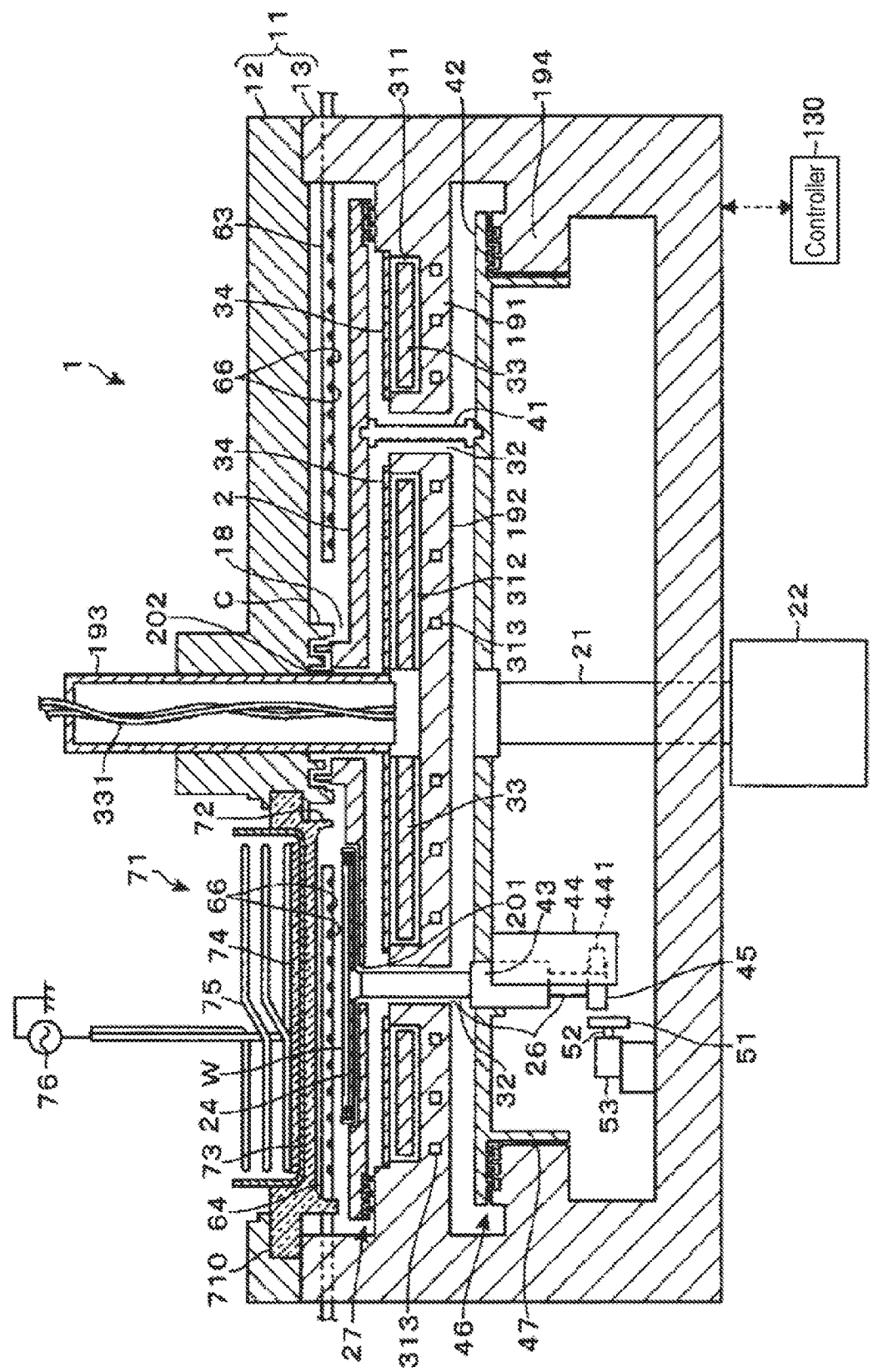
FIG. 1 is a longitudinal sectional view of a substrate processing apparatus according to an embodiment of the present disclosure.
Figure 2:
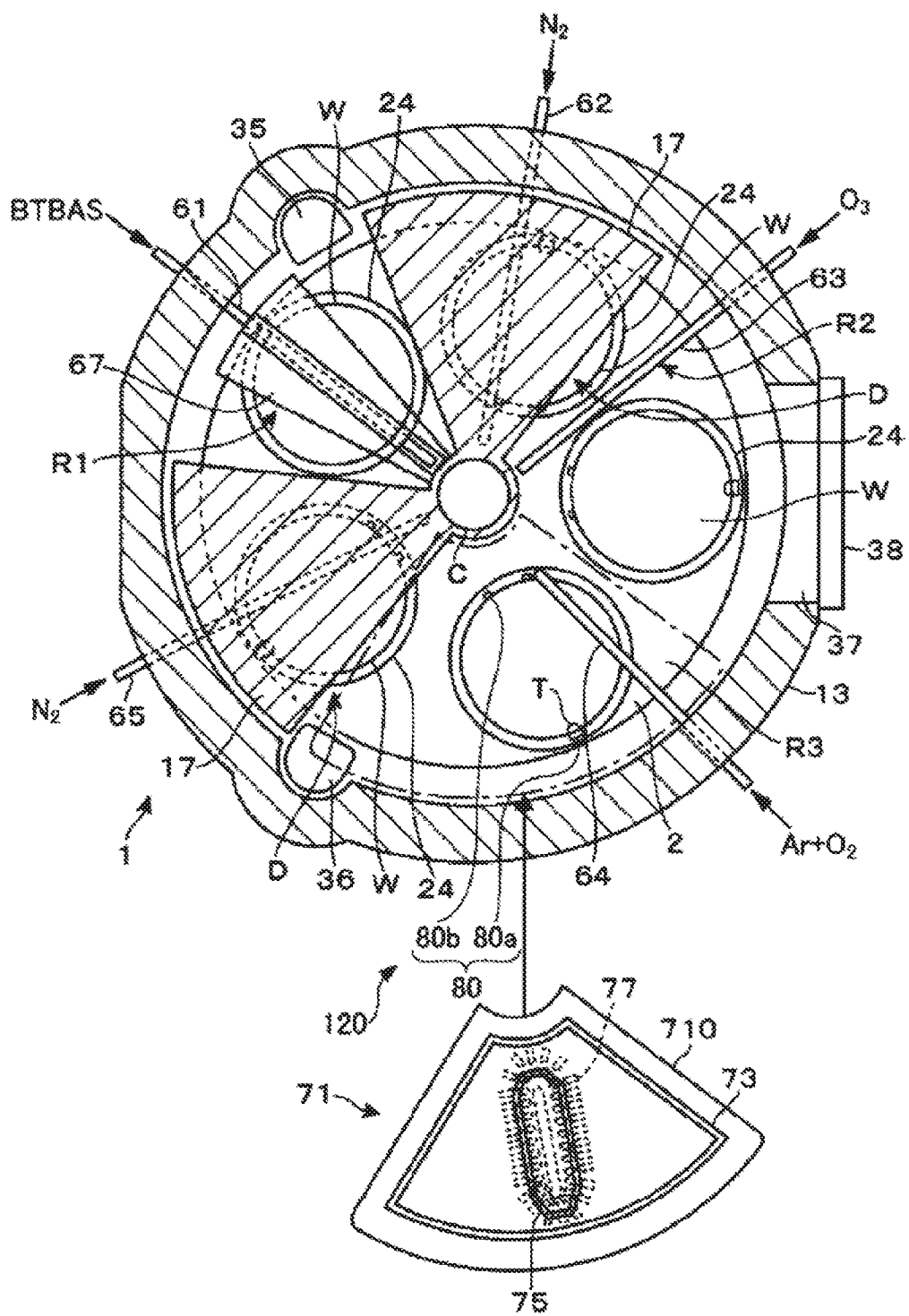
FIG. 2 is a transverse plan view of the substrate processing apparatus according to the embodiment of the present disclosure.

FIG. 1 is a sectional view of an example of the substrate processing apparatus according to an embodiment of the present disclosure. FIG. 2 is a plan view showing an internal configuration of a vacuum container in the example of the exemplary substrate processing apparatus according to the embodiment of the present disclosure.

As shown in FIGS. 1 and 2, the film forming apparatus 1 includes a substantially circular flat vacuum container (processing container or processing chamber) 11 and a circular rotary table 2 horizontally arranged within the vacuum container 11. The vacuum container 11 includes a ceiling plate 12 and a container body 13 which constitutes the sidewall and bottom of the vacuum container 11.

The rotary table 2 is coupled to a rotary shaft 21 via a supporting plate 42 to be described later. The rotary shaft 21 extends vertically downward from a position below the central portion of the rotary table 2. The rotary shaft 21 penetrates through a bearing portion (not shown) provided in the bottom of the container body 13 so as to keep the interior of the vacuum container 11 airtight from an external atmosphere. The rotary shaft 21 is connected to a rotation driver for revolution 22 used as a second rotation mechanism which is disposed below the container body 13. By using the rotation driver for revolution 22 to rotate the rotary shaft 21, the rotary table 2 may be rotated clockwise when viewed from the top.

On a lower surface of the ceiling plate 12 constituting the vacuum container 11 are formed a downwardly-protruded central region forming portion C that has a circular shape in a plan view so as to face the central portion of the rotary table 2, and protruded portions 17 which have a fan shape in a plan view so as to spread outward from the central region forming portion C. A combination of the central region forming portion C and the protruded portions 17 form a ceiling surface, which is lower than the outer region thereof, in an internal space of the vacuum container 11. A gap between the central region forming portion C and the central portion of the rotary table 2 serves as a $N_2$ gas flow path 18. During processing of the wafer W, a $N_2$ gas is supplied from a gas supply pipe (not shown) toward the inner region of the central region forming portion C and is discharged from the flow path 18 toward the entire outer periphery of the rotary table 2. The $N_2$ gas serves to prevent the raw material gas and the oxidizing gas from coming into contact with each other on the central portion of the rotary table 2.

As shown in FIGS. 1 and 2, a wafer holder 24 for holding the substrate is provided on the upper surface of the rotary table 2. The wafer holder 24 is provided with misalignment prevention mechanisms 120 for preventing misalignment of the wafer W inside the wafer holder 24. An inner diameter of the wafer holder 24 may be set to about 302 mm, when the wafer W has a diameter of 300 mm.

As shown in FIG. 2, each of the misalignment prevention mechanisms 120 includes a substrate misalignment prevention member 80 that is in contact with a lateral surface of the wafer W. The substrate misalignment prevention member 80 includes a notch deviation prevention member 80a that is in contact in engagement with a notch T of the wafer W, and an outer periphery deviation prevention member 80b which comes into contact with the lateral surface of the circular portion of the wafer W. The misalignment prevention mechanism 120 will be described in more detail later.

Figure 3:
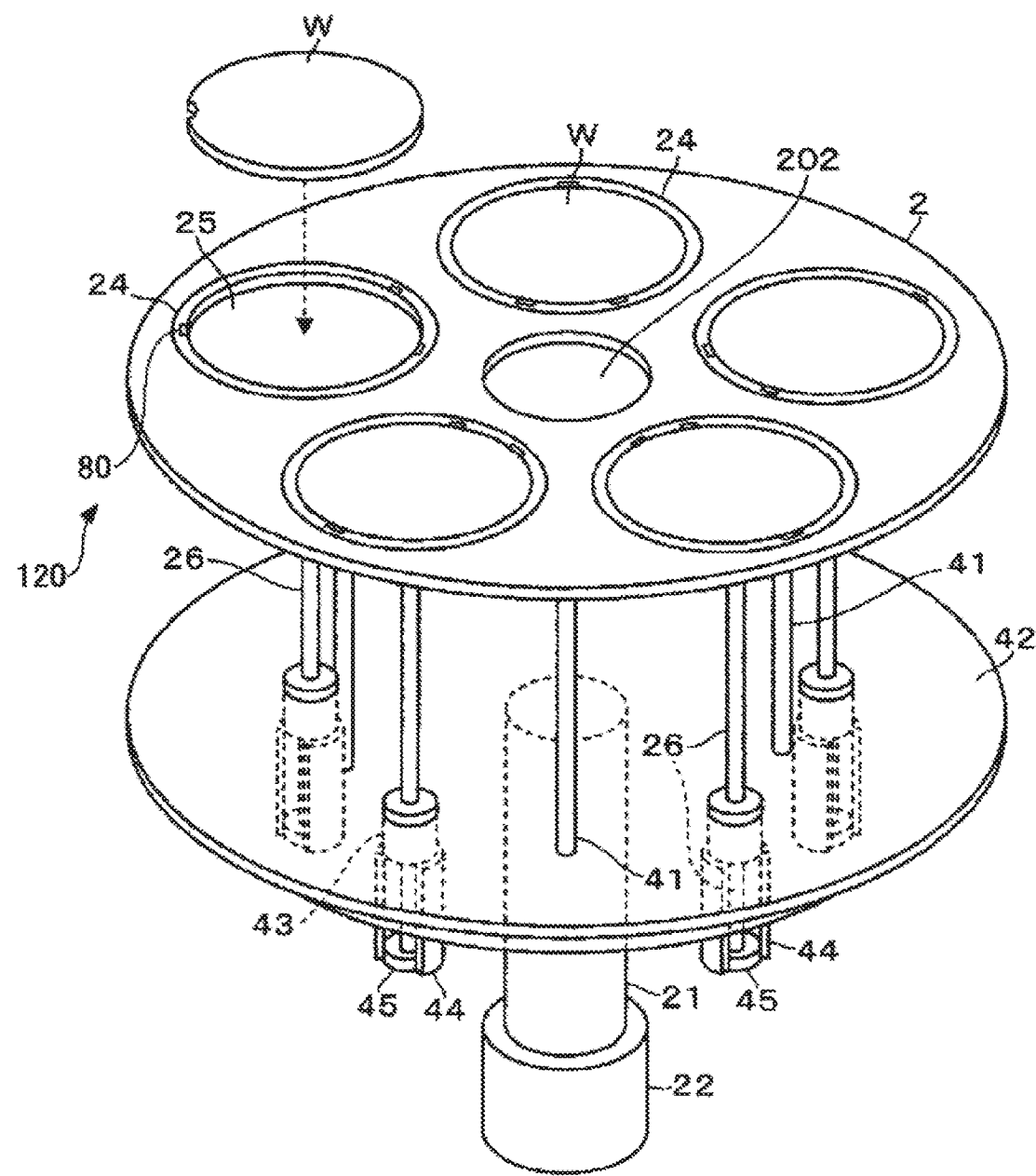
FIG. 3 is a perspective view of a rotary table included in the substrate processing apparatus according to the embodiment of the present disclosure.

Next, a structure below the rotary table 2 will be described. FIG. 3 is a view showing a structure below the rotary table 2 in the example of the substrate processing apparatus according to the embodiment of the present disclosure.

As shown in FIGS. 1 and 3, in the film forming apparatus 1 of the present embodiment, the rotary table 2 is supported from below by the disc-shaped supporting plate 42. Further, the supporting plate 42 supports the wafer holder 24 (to be described later) on which the wafer W is mounted, in a state of being separated from the rotary table 2. The supporting plate 42 has a structure of preventing a load of a device pertaining to the wafer holder 24 from being applied on the rotary table 2. The wafer holder 24 is a portion that holds the wafer W, namely a substrate holding portion. The substrate misalignment prevention member 80 of the misalignment prevention mechanism 120 is provided in the peripheral portion of the wafer holder 24.

On the other hand, as shown in FIG. 1, the internal space of the vacuum container 11 is vertically partitioned by a periphery-side transversal wall portion 191 and a center-side transversal wall portion 192 to separately accommodate the rotary table 2 and the supporting plate 42 which are vertically spaced apart at an interval.

In the present embodiment, the periphery-side transversal wall portion 191 is formed of an annular member that is formed so as to protrude in a transverse direction from an inner wall surface of the container body 13 toward the central portion of the container body 13. The center-side transversal wall portion 192 formed of a disc-shaped member is disposed inside an opening of the annular member constituting the periphery-side transversal wall portion 191 at substantially the same height position as the periphery-side transversal wall portion 191.

As shown in FIG. 1, the center-side transversal wall portion 192 is supported in a suspended state by a suspending pillar 193 that is provided to penetrate the central portion of the ceiling plate 12 in the vertical direction. In this case, an opening 202 through which the suspending pillar 193 penetrates is formed in the central portion of the rotary table 2 disposed above the center-side transversal wall portion 192, so that the rotational operation of the rotary table 2 is not hindered by the suspending pillar 193 that supports the center-side transversal wall portion 192 in a suspended state (see FIG. 3).

A diameter of the center-side transversal wall portion 192 is smaller than that of the opening of the periphery-side transversal wall portion 191. An annular slit 32 is formed between an outer peripheral surface of the center-side transversal wall portion 192 and an inner peripheral surface of the periphery-side transversal wall portion 191 so that spaces above and below the transversal wall portions 191 and 192 are in communicate with each other.

With the above-described configuration, the internal space of the vacuum container 11 is vertically divided so that the rotary table 2 is accommodated in the space above the periphery-side transversal wall portion 191 and the center-side transversal wall portion 192, and the supporting plate 42 supporting the rotary table 2 and so on is accommodated in the space below the periphery-side transversal wall portion 191 and the center-side transversal wall portion 192 (FIG. 1).

Further, as shown in FIG. 1, a recess 311 having an annular shape when viewed from the top is formed in an upper surface of the periphery-side transversal wall portion 191. A recess 312 having a circular shape when viewed from the top is formed in an upper surface of the center-side transversal wall portion 192. A heater 33 for heating the wafer W mounted on the upper surface of the rotary table 2 is disposed in each of the recesses 311 and 312. The heater 33 may have a configuration in which a plurality of heater elements formed of an elongated tubular carbon wire heater, are annularly arranged. In FIG. 1 and the like, the heater 33 is shown in a simplified manner.

Power may be supplied to the heater 33 of the center-side transversal wall portion 192 via a feeder line 331 disposed inside the suspending pillar 193. On the other hand, power is supplied to the heater 33 of the periphery-side transversal wall portion 191 via a feeder line (not shown) disposed so as to penetrate the sidewall of the container body 13.

$N_2$ gas is supplied from a gas nozzle (not shown) into an internal space of each of the recesses 311 and 312 in which the heater 33 is disposed, thereby preventing the processing gas or the like from being introduced into the internal space. An opening defined above each of the recesses 311 and 312 is blocked by a shield 34.

Further, a coolant flow path 313 through which a coolant for cooling members constituting the periphery-side transversal wall portion 191 and the center-side transversal wall portion 192 flows is formed in the lower portion of each of the periphery-side transversal wall portion 191 and the center-side transversal wall portion 192 in which the heater 33 kept at a high temperature is accommodated. The $N_2$ gas and the coolant are also supplied via an $N_2$ gas flow path and a coolant supply path (both not shown) formed in the suspending pillar 193 or the sidewall of the container body 13.

Figure 4:
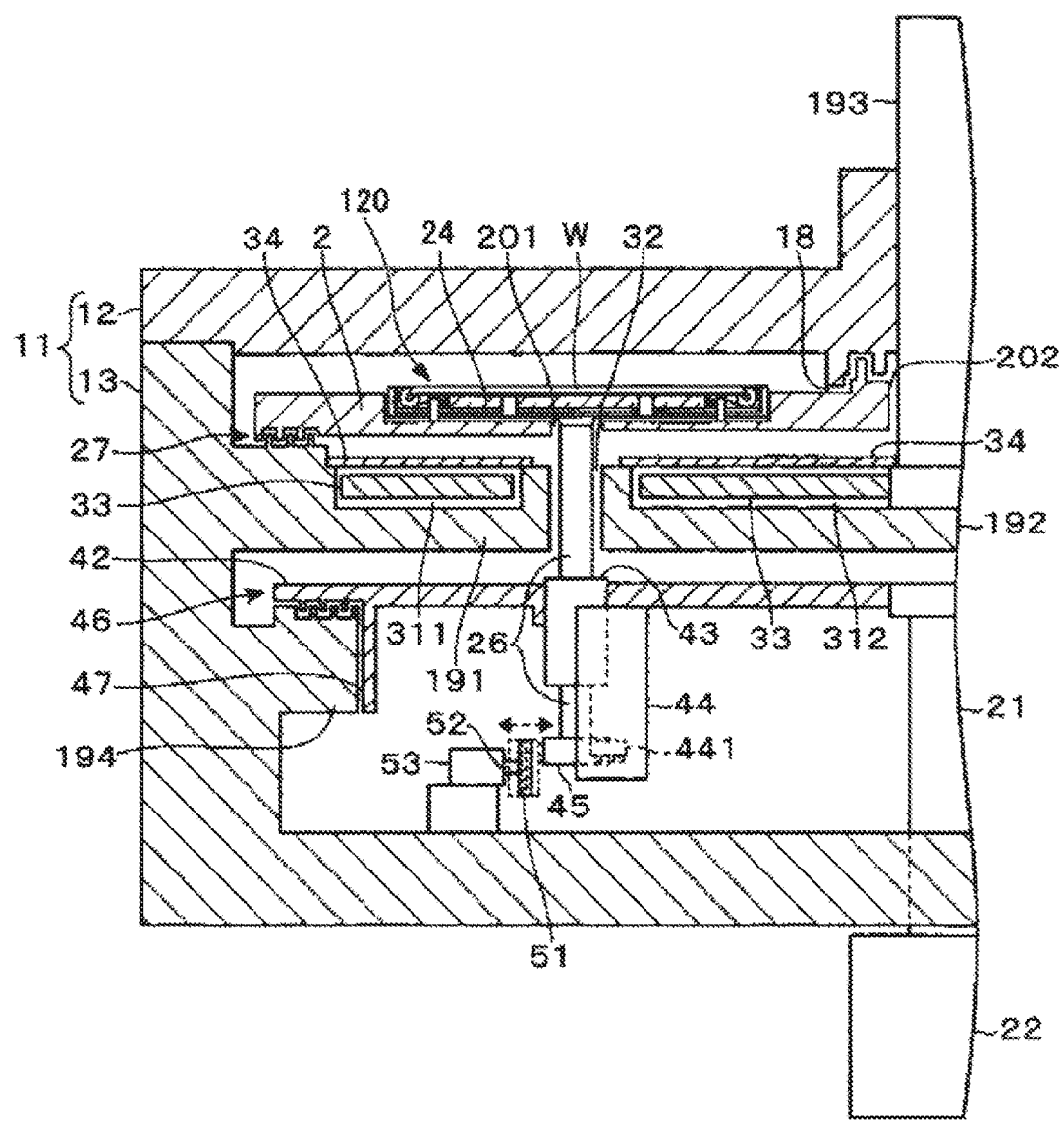
FIG. 4 is an enlarged longitudinal sectional view of the substrate processing apparatus according to the embodiment of the present disclosure.

Further, as shown in FIG. 1 and an enlarged longitudinal sectional view of FIG. 4, a labyrinth sealing portion 27 is provided between a peripheral region of the lower surface of the rotary table 2 and a peripheral region of the upper surface of the periphery-side transversal wall portion 191. The labyrinth sealing portion 27 is formed by combining a plurality of annular protrusions and annular grooves formed in the lower surface of the rotary table 2 and a plurality of annular protrusions and annular grooves formed in the upper surface of the periphery-side transversal wall portion 191. The labyrinth sealing portion 27 has a function of preventing various processing gases supplied onto the upper surface of the rotary table 2 from entering a space at the side of the lower surface of the rotary table 2 and further preventing particles generated in a bearing unit 43 (to be described later) from entering a space above the rotary table 2.

Further, as shown in FIG. 2, exhaust ports 35 and 36 for exhausting the interior of the vacuum container 11 are formed outside the rotary table 2 in the space above the periphery-side transversal wall portion 191 and the center-side transversal wall portion 192. A vacuum exhaust mechanism (not shown) including a vacuum pump and so on is connected to the exhaust ports 35 and 36.

Subsequently, the structure of the rotary table 2 will be described in more detail with reference also to FIG. 3.

The wafer holders 24 having a planar circular shape are provided at the side of the upper surface (the side of one surface) of the rotary table 2 along a rotational direction of the rotary table 2. A recess 25 is formed in an upper surface of each of the wafer holders 24. The wafer W is accommodated in the respective recess 25 in a horizontal posture. The wafer holder 24 is a wafer mounting area on which the wafer W is mounted.

A plurality of supporting columns 41 is provided on the lower surface of the rotary table 2 in a mutually spaced-apart relationship along the circumferential direction of the rotary table 2 so as to extend vertically downward from a position corresponding to the slit 32 when viewed from the center of the rotary table 2. As shown in FIG. 1, each of the supporting columns 41 passes through the slit 32 and is connected to the supporting plate 42 as a supporting part which is accommodated in the space below the periphery-side transversal wall portion 191 and the center-side transversal wall portion 192.

As shown in FIGS. 1 and 3, a central portion of a lower surface of the supporting plate 42 is connected to an upper end portion of the aforementioned rotary shaft 21. Therefore, when the rotary shaft 21 is rotated, the rotary table 2 is rotated around the vertical axis via the supporting plate 42 and the supporting columns 41.

Next, a configuration of the wafer holder 24 will be described.

A rotational axis 26 for supporting the wafer holder 24 is provided at the central portion of the lower surface of each of the wafer holders 24 so as to extend vertically downward. The rotational axis 26 is inserted into an opening 201 formed in the rotary table 2, penetrates the slit 32, and is supported by the bearing unit 43 fixed to the supporting plate 42. Therefore, the wafer holder 24 is supported by the supporting plate 42 via the respective rotational axis 26 independently of the rotary table 2.

The bearing unit 43 includes bearings for rotatably holding the rotational axis 26, and a magnetic seal for preventing scattering of particles from the bearings (all not shown). A lower portion of the rotational axis 26 penetrates the bearing unit 43 and extends downward from a lower surface of the supporting plate 42. A lower end portion of the rotational axis 26 is provided with a driven gear 45 (to be described later).

As shown in FIGS. 1 and 4, a peripheral region of the lower surface of the supporting plate 42 is disposed to face an upper surface of an annularly protruded portion 194 that is formed so as to protrude laterally from the inner wall surface of the container body 13 toward the central portion of the container body 13. A labyrinth sealing portion 46 is provided between the supporting plate 42 and the protruded portion 194. The labyrinth sealing portion 46 is formed by combining a plurality of annular protrusions and grooves formed in a lower surface of the supporting plate 42 and a plurality of annular protrusions and grooves formed in an upper surface of the protruded portion 194.

Further, a cylindrical wall portion 47 is formed inward of the labyrinth sealing portion 46 so as to extend downward from the lower surface of the supporting plate 42. The cylindrical wall portion 47 is inserted inward of the aforementioned protruded portion 194 such that a narrow gap is defined between an outer peripheral surface of the cylindrical wall portion 47 and an inner peripheral surface of the protruded portion 194.

The labyrinth sealing portion 46 and the cylindrical wall portion 47 have a function of preventing various processing gases from entering a space below the supporting plate 42 from an upper surface of the supporting plate 42 and further preventing particles generated in the bearing unit 43 and a rotary driving part 53 (to be described later) from entering a space above the supporting plate 42.

As shown in FIG. 4, the misalignment prevention mechanism 120 is provided on an outer lateral surface of the wafer mounting area of each of the wafer holders 24. Details of the misalignment prevention mechanism 120 will be described later.

Another structure of the vacuum container 11 will be described. As shown in FIG. 2, a transfer port 37 through which the wafer W is transferred and a gate valve 38 for opening and closing the transfer port 37 are provided in the sidewall of the container body 13. By advancing an external transfer mechanism into the vacuum container 11 through the transfer port 37, the wafer W is delivered between the transfer mechanism and the wafer holder 24. Specifically, through-holes vertically penetrating the bottom of the recess 25 of the wafer holder 24, the periphery-side transversal wall portion 191, the supporting plate 42 and the bottom of the container body 13 are formed. Once the wafer holder 24 is moved to a position facing the transfer port 37, lifting pins 16 (see FIG. 14) are moved up and down through the through-holes such that upper ends of the lifting pins 16 are moved up and down between the side of an upper surface of the recess 25 and below the supporting plate 42. In this way, the delivery of the wafer W is performed via the lifting pins 16. In FIG. 4, illustration of the lifting pins 16 and the through-holes are omitted.

Further, as shown in FIGS. 1 and 2, a raw material gas nozzle 61, a separation gas nozzle 62, an oxidizing gas nozzle 63, a plasma generating gas nozzle 64 and a separation gas nozzle 65 are arranged at intervals in this order above the rotary table 2 in the rotational direction of the rotary table 2. Each of the gas nozzles 61 to 65 is formed in a rod shape extending horizontally from the sidewall of the vacuum container 11 toward the central portion thereof along the radial direction of the rotary table 2. Each of the gas nozzles 61 to 65 discharges various gases downward from a plurality of discharge holes 66 that are formed in a mutually spaced-apart relationship with each other along the radial direction.

The raw material gas nozzle 61 discharges the aforementioned BTBAS (bis-tertiarybutylaminosilane) gas as a raw material gas. As shown in FIG. 2, a nozzle cover 67 covering the raw material gas nozzle 61 is provided as necessary. The nozzle cover 67 is formed in a fan shape that spreads from the raw material gas nozzle 61 toward the upstream side and the downstream side in the rotational direction of the rotary table 2. The nozzle cover 67 serves to increase adsorptivity of the BTBAS gas onto the wafer W by increasing the concentration of the BTBAS gas below the nozzle cover 67. The oxidizing gas nozzle 63, which serves as a reaction gas supply part configured to supply a reaction gas reacting with the raw material gas to produce a reaction product, discharges the aforementioned ozone gas as the reaction gas. Each of the separation gas nozzles 62 and 65 discharges the $N_2$ gas, and is disposed at a position where the fan-shaped protruded portion 17 of the ceiling plate 12 are divided in the circumferential direction when viewed from the top.

The plasma generating gas nozzle 64 discharges a plasma generating gas including, for example, a mixture of an argon (Ar) gas and an oxygen ($O_2$) gas.

Further, a fan-shaped opening is formed in the ceiling plate 12 along the rotational direction of the rotary table 2. A plasma forming part 71 is provided to close the opening. The plasma forming part 71 includes a cup-like main body 710 made of dielectric such as quartz. The opening of the ceiling plate 12 is closed by the main body 710. The plasma forming part 71 is provided between the oxidizing gas nozzle 63 and the protruded portion 17 when viewed in the rotational direction of the rotary table 2. A position at which the plasma forming part 71 is provided is indicated by a dashed dotted line in FIG. 2.

As shown in FIG. 1, a protruded portion 72 is formed on a lower surface of the main body 710 so as to protrude downward along the aforementioned fan-shaped opening. A leading end of the plasma generating gas nozzle 64 is inserted from the side of the outer periphery of the rotary table 2 into an area surrounded by the protruded portion 72 so that a gas can be discharged into the area surrounded by the protruded portion 72. The protruded portion 72 serves to prevent the $N_2$ gas, the ozone gas and the BTBAS gas from introducing below a plasma processing region R3, thereby preventing a decrease in concentration of the plasma generating gas.

A recess is formed in an upper surface of the main body 710 of the plasma forming part 71. A box-like Faraday shield 73 is disposed in the recess so as to be opened upward. An antenna 75 formed by winding a metal wire in a coil shape around a vertical axis is provided in a lower portion of the Faraday shield 73 via an insulating plate member 74. A high frequency power supply 76 is connected to the antenna 75.

Further, a plurality of slits 77 is formed in the bottom of the Faraday shield 73. The slits 77 prevent electric field components of an electromagnetic field generated in the antenna 75 during the application of a high frequency power to the antenna 75 from being directed downward, and allow magnetic components of the electromagnetic field to be directed downward. As shown in FIG. 2, the slits 77 extend in a direction orthogonal to (crossing) the winding direction of the antenna 75 and are formed along the winding direction of the antenna 75.

In the plasma forming part 71 configured as above, when the high frequency power supply 76 is turned on to apply the high frequency power to the antenna 75, the plasma generating gas supplied below the plasma forming part 71 can be plasmarized.

For the sake of convenience in illustration, the plasma forming part 71, the plasma generating gas nozzle 64 provided below the plasma forming part 71, and the coolant flow path 313 are omitted in the enlarged longitudinal sectional view of FIG. 4.

On the rotary table 2, a region below the nozzle cover 67 of the raw material gas nozzle 61 is referred to as an adsorption region R1 where adsorption of the BTBAS gas as a raw material gas is performed, and a region below the oxidizing gas nozzle 63 is referred to as an oxidation region R2 where oxidation of the BTBAS gas by the ozone gas is performed. Further, a region below the plasma forming part 71 is referred to as a plasma processing region R3 where modification of a $SiO_2$ film by plasma is performed. A region below the protruded portion 17 is referred to as a separation region D where the adsorption region R1 and the oxidation region R2 are separated from each other by the $N_2$ gas discharged from the separation gas nozzles 62 and 65 to prevent mixing of the raw material gas and the oxidizing gas.

The exhaust port 35 formed in the container body 13 is opened outward between the adsorption region R1 and the separation region D adjacent to the adsorption area R1 at the downstream side in the rotational direction. An excess BTBAS gas is exhausted through the exhaust port 35. Further, the exhaust port 36 is opened outward in the vicinity of the boundary between the plasma processing region R3 and the separation region D adjacent to the plasma processing region R3 at the downstream side in the rotational direction. Excess $O_3$ gas and plasma generating gas are exhausted through the exhaust port 36. The $N_2$ gas supplied from the separation regions D and the central region forming portion C of the rotary table 2 is also exhausted from each of the exhaust ports 35 and 36.

In the film forming apparatus 1 configured as above, when rotating the rotary table 2 to revolve the wafer W mounted on the wafer holder 24 around the vertically-extending rotary shaft 21, each of the wafer holders 24 can rotate about the rotational axis 26 that extends in the vertical direction and supports the central portion of the lower surface of the wafer holder 24.

Hereinafter, a mechanism for rotating the wafer holder 24 about its own axis will be described in detail with reference to FIGS. 4 and 5 and so on.

Figure 5:
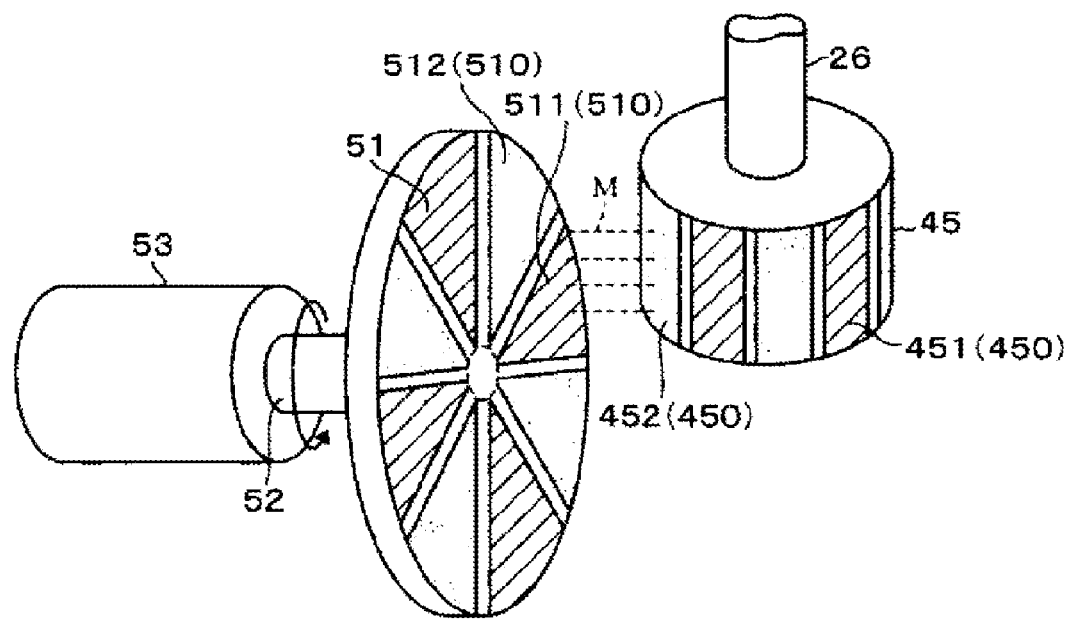
FIG. 5 is an enlarged perspective view of a magnetic gear mechanism for rotating a wafer holder provided in the rotary table.

As shown in FIGS. 4 and 5, a lower end portion of the rotational axis 26 penetrating through the bearing unit 43 is connected to an upper surface of the driven gear 45 as a flat column, in a state where central axes of the rotational axis 26 and the driven gear 45 coincide with each other. Accordingly, the driven gear 45 is coupled to the wafer holder 24 via the rotational axis 26. Further, since the bearing unit 43 rotatably holds the rotational axis 26, the wafer holder 24 can be rotated about the rotational axis 26 when the driven gear 45 is rotated in the circumferential direction.

As shown in FIG. 5, a plurality of permanent magnets 450 is arranged at intervals on a peripheral plane of the driven gear 45. The permanent magnets 450 are alternately arranged such that poles (N-pole planes 451 and S-pole planes 452) exposed on the peripheral plane of the driven gear 45 are different between the adjacent permanent magnets 450 and 450. Each of the N-pole planes 451 and the S-pole planes 452 exposed on the peripheral plane of the driven gear 45 may be formed in a rectangle extending in the vertical direction from the upper edge toward the lower edge of the peripheral plane. The peripheral plane of the driven gear 45 in which the plurality of permanent magnets 450 is arranged corresponds to a driven plane of the driven gear 45.

Figure 6:
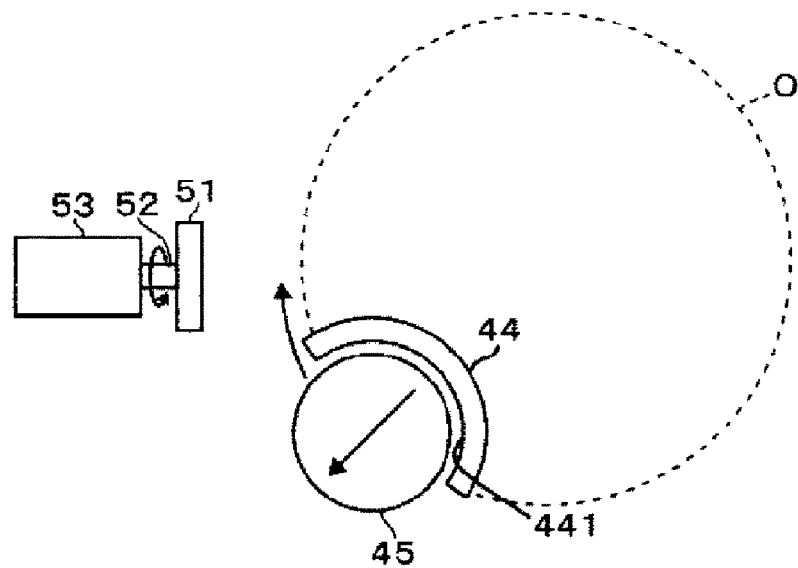
FIG. 6 is a first operation view of the magnetic gear mechanism.
Figure 7:
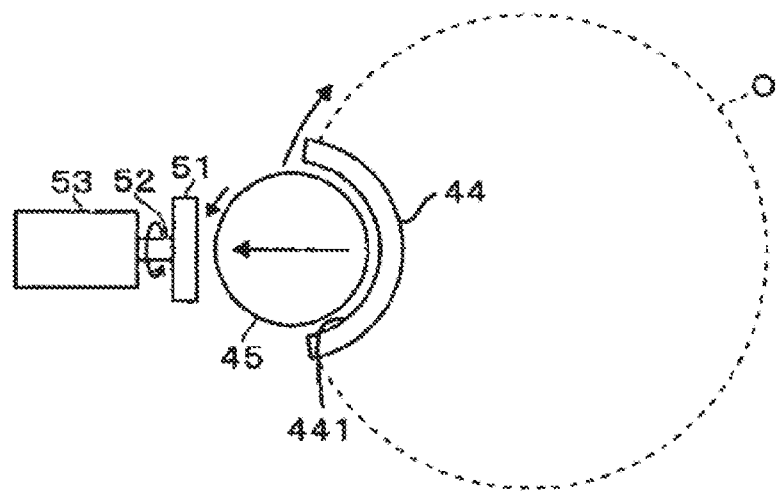
FIG. 7 is a second operation view of the magnetic gear mechanism.
Figure 8:
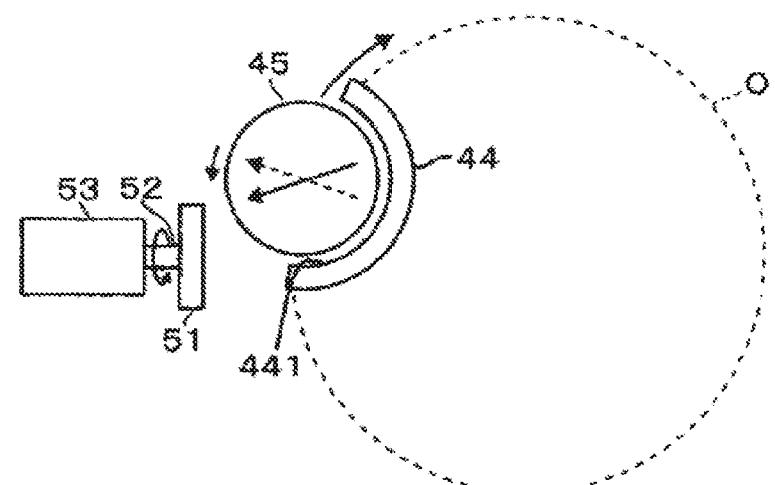
FIG. 8 is a third operation view of the magnetic gear mechanism.

As described above, since the rotational axis 26 connected to the driven gear 45 is supported by the supporting plate 42 common to the rotary table 2, the rotational axis 26 also revolves around the rotary shaft 21 along the respective slit 32 when rotating the rotary table 2. Accordingly, the driven gear 45 provided at the lower end portion of the rotational axis 26 also moves along a movement trajectory O corresponding to the respective slit 32 (see the movement trajectory O indicated by a broken line in FIGS. 6 to 8).

As shown in FIG. 4, a driving gear 51 as a circular plate for rotating the driven gear 45 in the circumferential direction is disposed at the bottom of the container body 13 below the supporting plate 42. The driving gear 51 is disposed at a position where one plane of the circular plate faces the peripheral plane (driven plane) of the driven gear 45 when the driven gear 45 passes a preset position on the movement trajectory O.

As shown in FIG. 5, a plurality of permanent magnets 510 is arranged at intervals on the one plane of the driving gear 51. The permanent magnets 510 are alternately arranged such that poles (N-pole planes 511 and S-pole planes 512) exposed on the one plane of the driving gear 51 are different between the adjacent permanent magnets 510 and 510.

Each of the N-pole planes 511 and the S-pole planes 512 exposed on the one plane of the driving gear 51 is formed in a fan shape which spreads in the radial direction from the central portion toward the peripheral portion of the one plane of the driving gear 51 having a circular shape. Thus, when the driven gear 45 passes through a region facing the one plane, the N-pole planes 511 and the S-pole planes 512 overlap, in shape, the N-pole planes 451 and the S-pole planes 452 arranged on the peripheral plane of the driven gear 45. In the driving gear 51, the one plane on which the plurality of permanent magnets 510 is arranged corresponds to a driving plane of the driving gear 51.

Further, in the driving gear 51, one end (leading end) of a driving shaft 52 is connected to the central portion of a plane opposite to the one plane on which the permanent magnets 510 are arranged. A rotation driving part 53 is provided at the other end of the driving shaft 52. By rotating the driving shaft 52 using the rotation driving part 53, the driving gear 51 can be rotated around the rotational center. As shown in FIG. 5, the driving shaft 52 of the driving gear 51 is disposed so as to extend in a direction crossing the rotational axis 26 that is connected to the driven gear 45.

Further, the rotation driving part 53 can move a position of the leading end of the driving shaft 52 connected to the driving gear 51 backward and forward. As a result, as indicated by a broken line in FIG. 4, a distance between the one plane (driving plane) of the driving gear 51 and the peripheral plane (driven plane) of the driven gear 45 can be adjusted. The rotation driving part 53 for moving the position of the leading end of the driving shaft 52 also has a function of a position adjusting part of the present embodiment.

The driving gear 51 is disposed at a height position at which, when the driven gear 45 passes a position facing the driving gear 51, the peripheral plane of the driven gear 45 passes above the central portion of the one plane of the driving gear 51. As a result, as shown in FIG. 5, the permanent magnets 450 formed in the driven gear 45 and the permanent magnets 510 formed in the driving gear 51 become close to each other. Thus, relatively strong magnetic force lines M are generated between the N-pole planes 511 and the S-pole planes 452 or between the S-pole planes 512 and the N-pole planes 451, respectively.

For example, by rotating the driving gear 51 (by moving the driving plane) to move the permanent magnets 510 of the driving gear 51 in a direction opposite to the movement direction of the permanent magnets 450 of the driven gear 45, the magnetic force lines M can move to rotate the driven gear 45. As a result, the rotation force of the driven gear 45 is applied to the wafer holder 24 through the rotational axis 26, thus rotating the wafer holder 24.

A combination of the driven gear 45, the driving gear 51, the rotational axis 26 connecting the driven gear 45 and the wafer holder 24, the rotation driving shaft 52 for driving the driving gear 51, the rotation driving part 53 and the like constitutes a magnetic gear mechanism of the present embodiment.

Further, as shown in FIG. 3, FIG. 4 and the like, a semi-cylindrical sidewall portion 44 is provided on the lower surface of the supporting plate 42 so as to surround the bearing unit 43 protruding from the lower surface of the supporting plate 42, the rotation shaft 26, and a portion of the peripheral plane of the driven gear 45. The sidewall portion 44 is provided to surround the peripheral plane of the driven gear 45 at a side opposite the side where the driving gear 51 is disposed.

A semi-annular brake 441 made of, e.g., a ferromagnetic material, is formed in a lower portion of an inner peripheral surface of the sidewall portion 44. For example, a distance between the peripheral plane of the driven gear 45 and the brake 441 is adjusted so that magnetic force lines generated between the permanent magnets 450 of the driven gear 45 and the brake 441 becomes weaker than those generated between the driven gear 45 and the driving gear 51.

As a result, when the driven gear 45 passes through a position facing the driving gear 51, a force acting between the driven gear 45 and the driving gear 51 rotates the driven gear 45. On the other hand, after the driven gear 45 passes through the position, the free rotation of the driven gear 45 accompanying an inertial force or the like can be suppressed by a force acting between the driven gear 45 and the brake 441. An inner peripheral plane of the brake 441 surrounding the peripheral plane of the driven gear 45 corresponds to a brake surface by which the rotation of the driven gear 45 is stopped.

Using such a rotation mechanism as a first rotation mechanism, the wafer holders 24 can be rotated in addition to the rotation of the rotary table 2. This improves in-plane uniformity. That is to say, since the wafer holders 24 are arranged along the circumferential direction of the rotary table 2, the wafer W disposed in the respective wafer holder 24 has a difference in movement speed depending on each position in the wafer W due to a difference in distance from the center of the rotary table 2. In other words, a movement speed at a position close to the rotational center of the rotary table 2 is low and a movement speed at a position near the outer periphery of the rotary table 2 is high. Thus, when the film forming process is performed, there may be a case where a difference in the film forming process is caused depending on positions in the radial direction of the rotary table 2. Even in such a case, by rotating the wafer holder 24, each position in the wafer W can pass near the rotational center or near the outer periphery of the rotary table 2. This makes it possible to perform a uniform film forming process as a whole, thereby improving the in-plane uniformity.

However, when the wafer holder 24 is rotated in this manner, the position of the wafer W inside the wafer holder 24 may be shifted.

Figure 9:
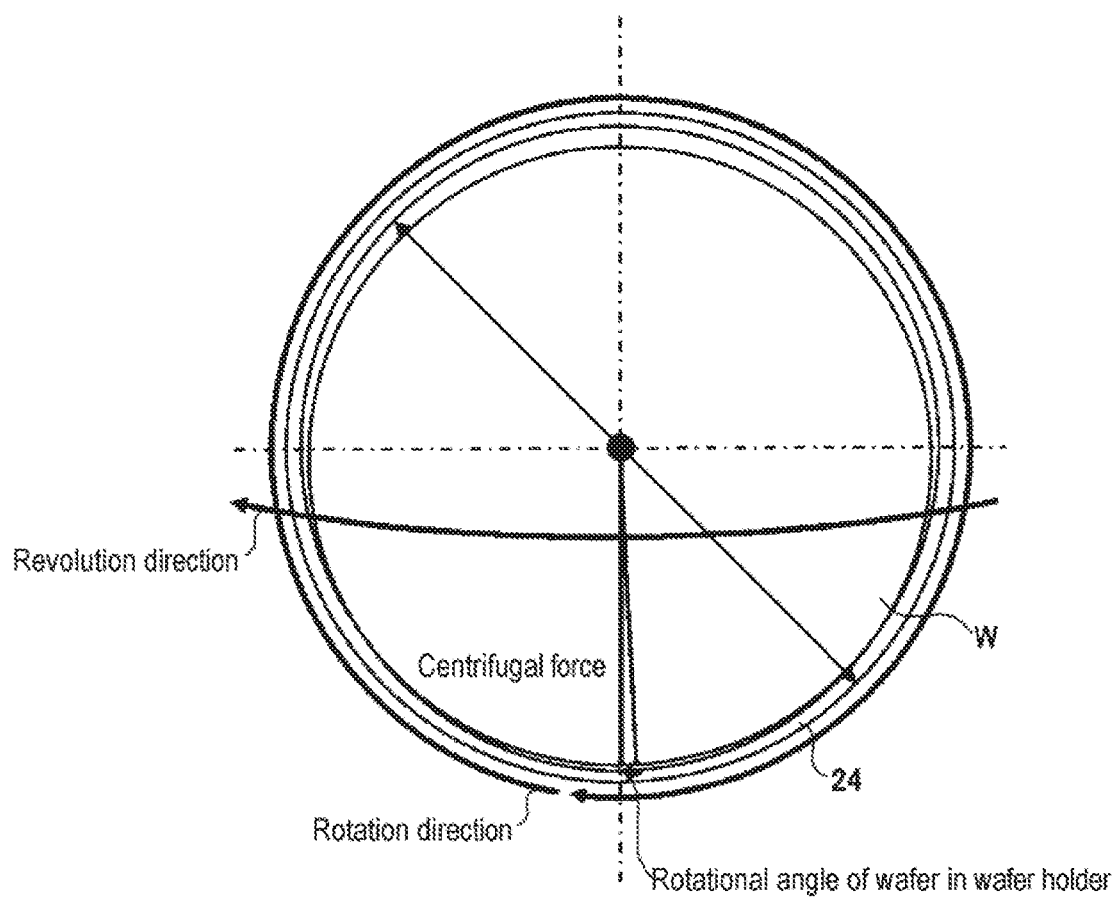
FIG. 9 is a view for explaining the state of a wafer mounted on the wafer holder.

FIG. 9 is a view for explaining a state of the wafer W mounted in the wafer holder 24. In FIG. 9, there is shown a case where the rotary table 2 is rotated clockwise and the wafer holder 24 is also rotated clockwise.

As shown in FIG. 9, in a case where the rotary table 2 is rotated at a certain rotational speed or higher without rotating about its own axis, the wafer W is pushed toward the outermost periphery of the wafer holder 24 by virtue of a centrifugal force. In this state, when the wafer holder 24 is rotated at a speed of 1 rpm, a direction in which the centrifugal force is applied shifted along with the rotation of the wafer holder 24. This causes a phenomenon in which the wafer W rotates along the inner wall of the wafer holder 24.

Assuming that the diameter of the wafer W is 300 mm and the inner diameter of the wafer holder 24 is 302 mm, a rotational angle of the wafer W moving with the rotation of the wafer holder 24 at a speed of 1 rpm is $(302\pi - 300\pi)/302\pi \times 360$ degrees/min=2.4 degrees-min.

The following Table 1 shows behavior prediction results in which the rotational angle of the wafer W is obtained based on the above calculation.

TABLE 1

|  | −2 rpm | −1 rpm | 0.5 rpm | 0 rpm | 0.5 rpm | 1.0 rpm | 2 rpm |
|---|---|---|---|---|---|---|---|
| Wafer rotational angle [degrees/min] | −4.8 | −2.4 | −1.2 | 0 | 1.2 | 2.4 | 4.8 |

As shown in Table 1, as the rotation speed is higher, the rotational angle of the wafer W inside the wafer holder 24 is larger.

In this regard, the degree of deviation of the notch T of the wafer W inside the wafer holder 24 was evaluated at five-minute intervals.

Figure 10:
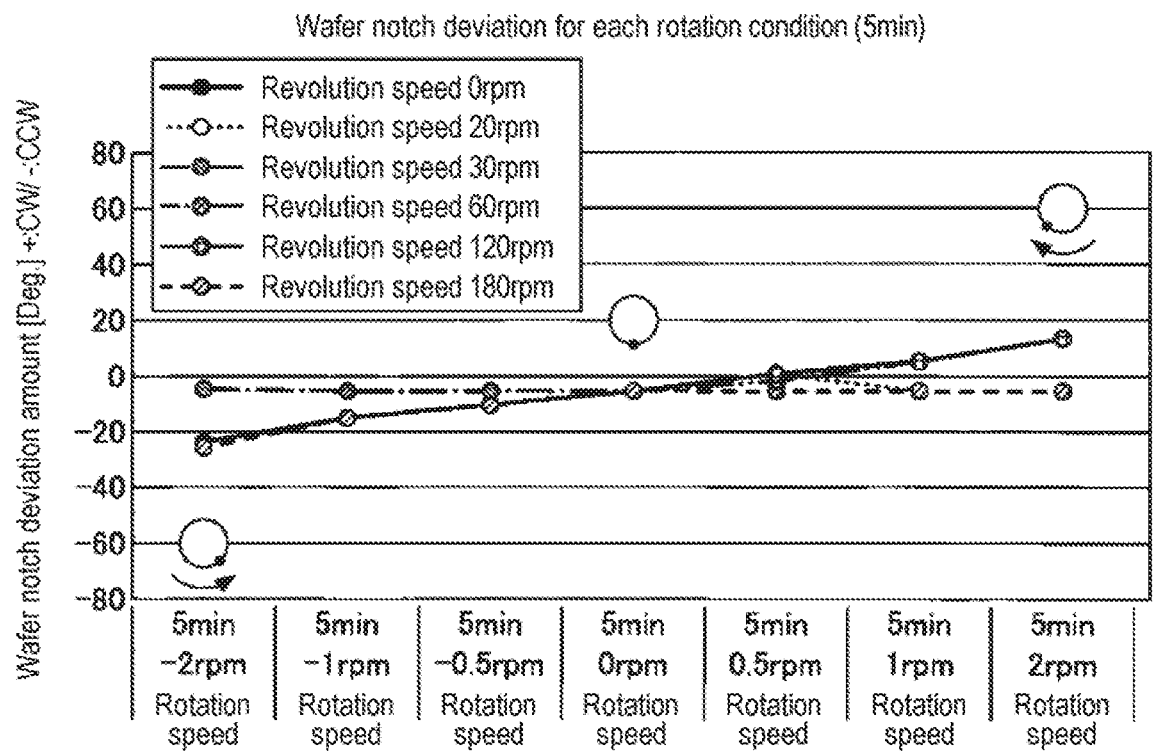
FIG. 10 is a view graphically showing the result of notch deviation evaluation.

FIG. 10 is a view graphically showing the results of notch deviation evaluation. In FIG. 10, the notch deviation evaluation was performed while changing the rotation speed within a range of from 0 to 2 rpm clockwise and counterclockwise, the rotation speed (revolution speed) of the rotary table 2 within a range of from 0 to 180 rpm. The state of changing the rotation speed was continued for 5 minutes. In FIG. 10, the clockwise direction is represented by + (positive but is omitted herein), and the counterclockwise direction is represented by − (negative).

The results of the notch deviation evaluation show that the deviation of the notch T of the wafer W was not substantially manifested at the revolution speed of 0 to 30 rpm, but was infrequently confirmed. The direction of deviation of the notch T is shifted in the clockwise direction when the rotational direction is clockwise (+), and is shifted in the counterclockwise direction when the rotational direction is counterclockwise (−). It was found that a higher rotational speed results in a larger amount of deviation. From this, it is considered that the amount of deviation of the notch T is not significantly affected by the revolution speed and tends to increase in proportion to the rotation speed.

Figure 11:
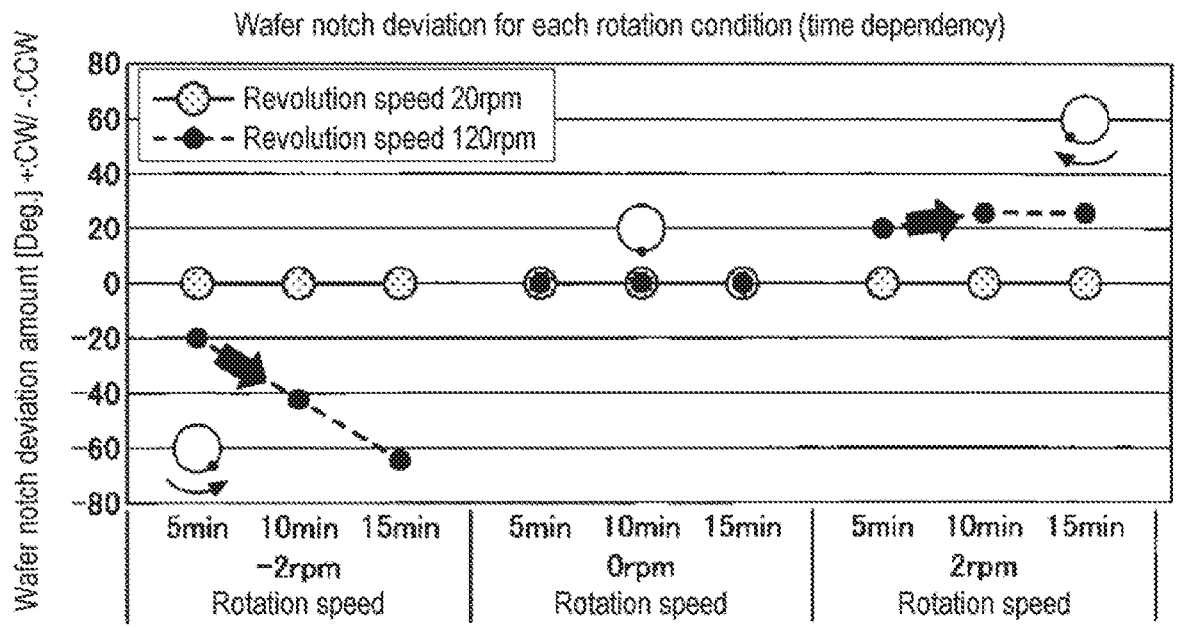
FIG. 11 is a view graphically showing the result obtained by evaluating dependence of misalignment of the wafer on time.

FIG. 11 is a view graphically showing the evaluation results of dependence of wafer misalignment on time. In order to evaluate the dependence of misalignment of the wafer W on time, the amount of deviation of the notch T was measured while increasing the length of time to 5 minutes, 10 minutes and 15 minutes.

Referring to FIG. 11, when the rotation speed was 0 rpm, there was no time dependency. On the other hand, when the rotation speed was set to −2 rpm and +2 rpm, no time dependency was seen when the revolution speed is 20 rpm. However, when the revolution speed was 120 rpm, the amount of deviation of the notch T increased with time. As described above, it was confirmed that when rotation was performed, the misalignment of the wafer W was increased with time.

In order to prevent such a misalignment of the wafer W, the substrate processing apparatus according to the present embodiment includes the misalignment prevention mechanism 120.

Figure 12A:
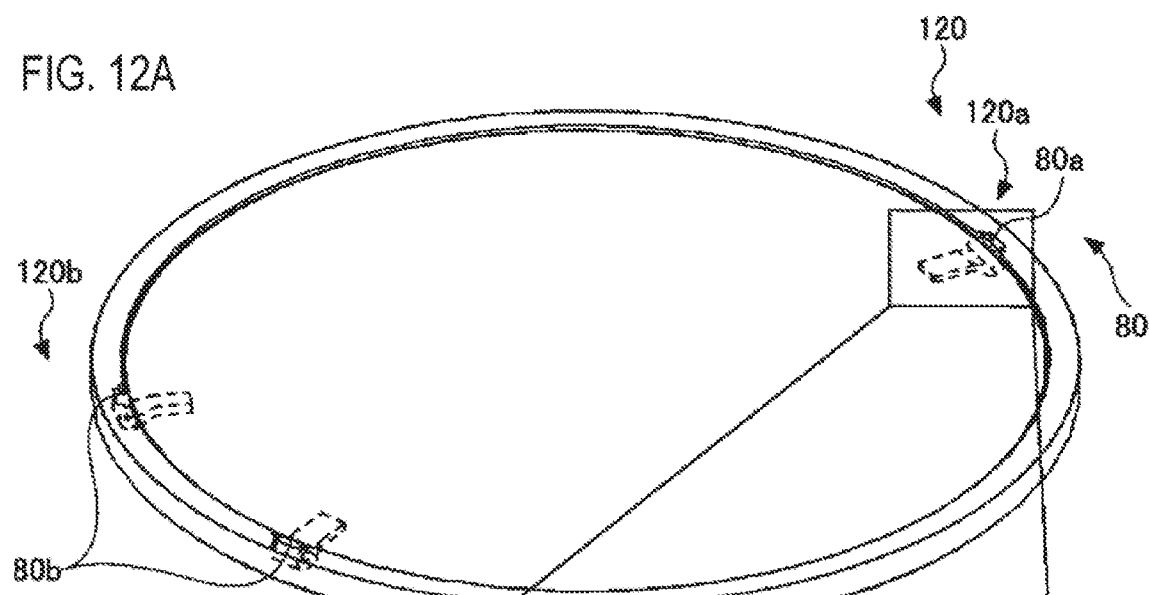
FIGS. 12A and 12B are perspective views of an example of a misalignment prevention mechanism in the substrate processing apparatus according to the embodiment of the present disclosure.
Figure 12B:
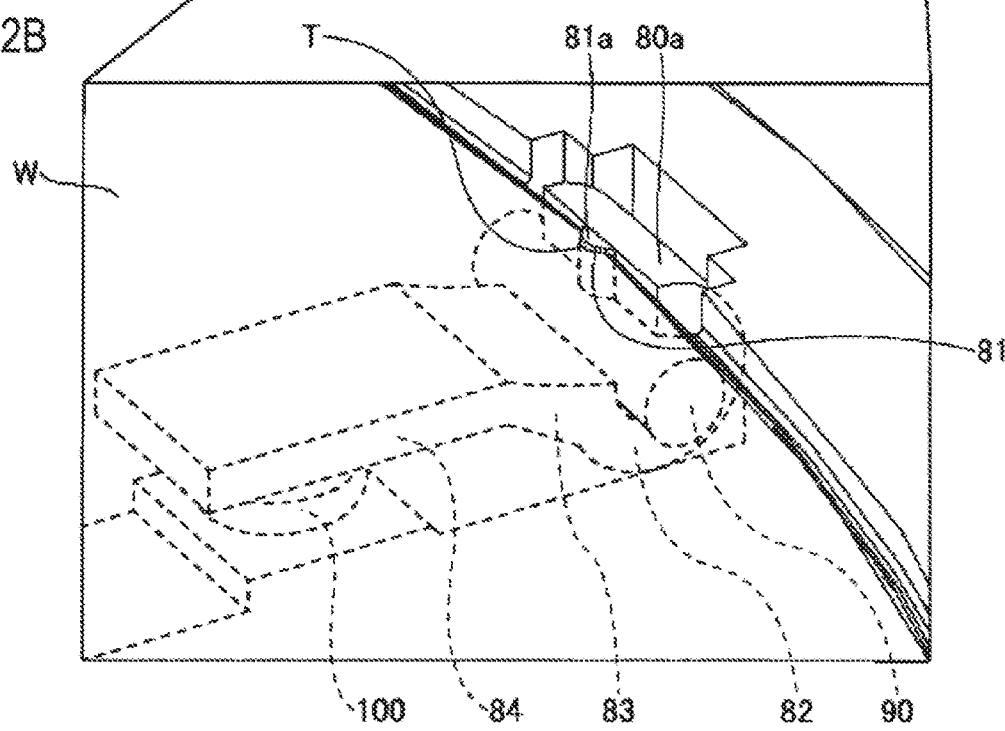

FIGS. 12A and 12B are perspective views of an example of the misalignment prevention mechanism 120 of the substrate processing apparatus according to the present embodiment. FIG. 12A is an overall perspective view of the misalignment prevention mechanism 120, and FIG. 12B is an enlarged perspective view of a notch deviation prevention mechanism 120a.

Referring to FIG. 12A, the misalignment prevention mechanism 120 includes the notch deviation prevention mechanism 120a and an outer periphery deviation prevention mechanism 120b. The notch deviation prevention mechanism 120a is a mechanism for preventing the deviation of the notch T of the wafer W. The outer periphery deviation prevention mechanism 120b is a mechanism for preventing the deviation of the circular periphery of the wafer W. The notch deviation prevention mechanism 120a is provided at a position where the notch T of the wafer W is disposed. The outer periphery deviation prevention mechanism 120b is provided at a position at which the outer periphery deviation prevention mechanism 120b can be in contact with the outer periphery of the wafer W opposite to the notch T. The notch is formed at only one place on the wafer W. Thus, the notch deviation prevention mechanism 120a is provided at only one place. On the other hand, since the misalignment of the wafer W cannot be prevented in a two-point support manner, a plurality of outer periphery deviation prevention mechanisms 120b is provided at least two places in a mutually spaced-apart relationship with each other. Thus, the wafer W is held by sandwiching the wafer W at least three points from both sides. If the spaced-apart distance is too short, it is difficult to prevent misalignment of the wafer W. Thus, in some embodiments, the outer periphery deviation prevention mechanisms 120b may be arranged while being spaced apart from each other to such an extent that respective directions oriented to the center of the rotary table 2 are different from each other. The notch deviation prevention member 80a and the outer periphery deviation prevention members 80b may not be pressed against the wafer W. The notch deviation prevention member 80a and the outer periphery deviation prevention members 80b are sufficient to prevent the misalignment of the wafer W only by being in contact with the wafer W without applying pressure to wafer W. A combination of the notch deviation prevention member 80a and the outer periphery deviation prevention members 80b is sometimes referred to as a substrate misalignment prevention member 80.

Referring to FIG. 12B, the notch deviation prevention mechanism 120a includes the notch deviation prevention member 80a, a rotary shaft 90 and a spring 100. The notch deviation prevention member 80a is a member that is brought into contact with the notch T of the wafer W to prevent the deviation of the notch T of the wafer W. The notch deviation prevention member 80a has a notch contact portion 81a, a rotating portion 82, a connection portion 83 and a reception portion 84.

The notch contact portion 81a used as a substrate contact portion is a surface that is brought into contact with the notch T of the wafer W and a lateral surface near the notch T. The notch contact portion 81a corresponds to a notch locking portion 810 projected inward to engage with the notch T, and flat surfaces at both sides of the notch locking portion 810. The notch contact portion 81a has a shape in which the notch locking portion 810 is brought into engagement with the notch T, thus preventing the misalignment of the wafer W in a reliable manner.

The rotating portion 82 is provided so as to rotate around the rotary shaft 90. The rotary shaft 90 is horizontally provided so as to extend along the outer peripheral surface of the wafer W. When the rotating portion 82 rotates around the rotary shaft 90, the notch deviation prevention member 80a rotates in the vertical direction.

The connection portion 83 connects the rotating portion 82 and the reception portion 84, and serves to deliver a force received by the reception portion 84 to the rotating portion 82 or deliver rotational movement of the rotating portion 82 to the reception portion 84.

The reception portion 84 serves to receive an elastic force of the spring 100 or a force of a fixing part (to be described later) and deliver the same to the connection portion 83.

The rotary shaft 90 is provided to rotatably support the notch deviation prevention member 80a. The spring 100 serves to provide the reception portion 84 with the elastic force.

Figure 13A:
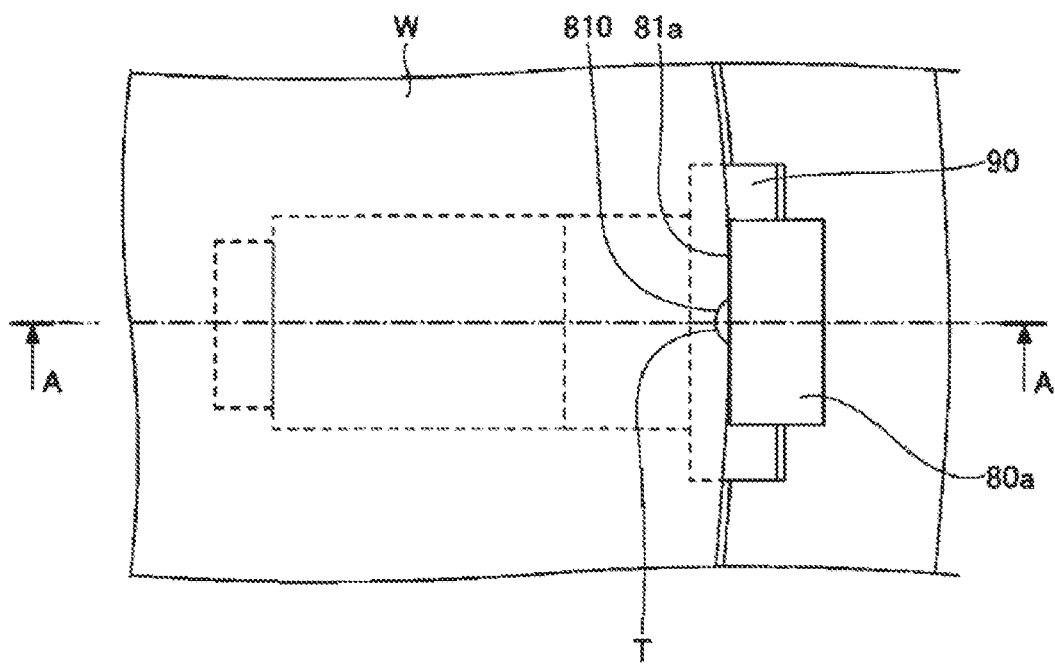
FIGS. 13A and 13B are enlarged views of the example of the misalignment prevention mechanism in the substrate processing apparatus according to the embodiment of the present disclosure.
Figure 13B:
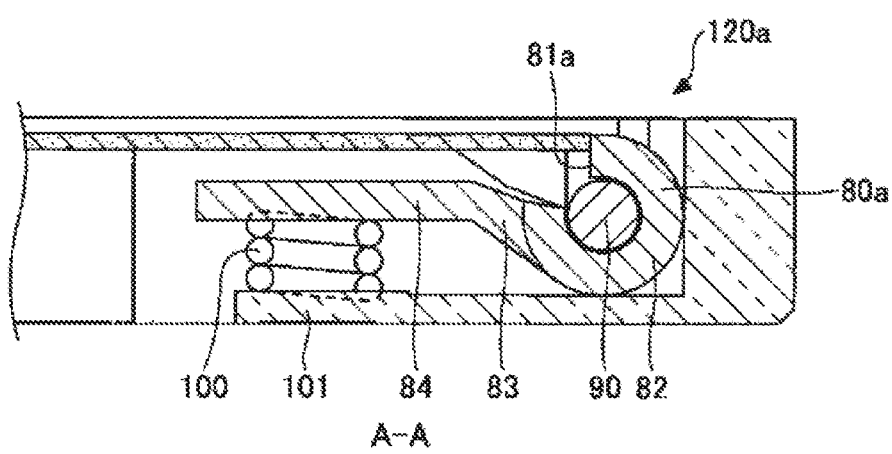

FIGS. 13A and 13B are enlarged views of the notch deviation prevention mechanism 120a. FIG. 13A is an enlarged plan view of the notch deviation prevention mechanism 120a, which is shown in a see-through manner. FIG. 13B is a sectional view taken along line A-A in FIG. 13A.

As shown in FIG. 13A, the notch locking portion 810 formed in the notch contact portion 81a of the notch deviation prevention member 80a is brought into engagement with the notch T of the wafer W, thereby reliably preventing misalignment caused by the rotation of the wafer W.

As shown in FIG. 13B, the notch contact portion 81a of the notch deviation prevention member 80a is in contact with the lateral surface of the wafer W having the notch T, and the rotating portion 82 is provided to rotate around the rotary shaft 90. The connection portion 83 connects the rotating portion 82 and the reception portion 84. The spring 100 is provided in contact with a lower surface of the reception portion 84. A spring supporting member 101 is provided on a lower end of the spring 100.

FIGS. 14A and 14B are sectional views for explaining a detailed structure and operation of the misalignment prevention mechanism 120 of the substrate processing apparatus according to the present embodiment. FIG. 14B is a view showing a state in which the misalignment prevention mechanism 120 holds the wafer W in a contact manner.

As shown in FIG. 14A, the misalignment prevention mechanism 120 according to the present embodiment includes the substrate misalignment prevention member 80, the rotary shaft 90, the spring 100, the spring supporting member 101 and the fixing part 110. As described above, the substrate misalignment prevention member 80 includes a substrate contact portion 81 (see FIG. 12B), the rotating portion 82, the connection portion 83 and the reception portion 84. The substrate misalignment prevention member 80 includes the notch deviation prevention member 80a and the outer periphery deviation prevention member 80b. The notch deviation prevention member 80a includes the notch contact portion 81a. The outer periphery deviation prevention member 80b includes an outer periphery contact portion 81b. In each of the notch deviation prevention member 80a and the outer periphery deviation prevention member 80b, the rotating portion 82, the connection portion 83 and the reception portion 84 are identical to each other in shape, and therefore will be shown without being particularly distinguished from one another. The notch contact portion 81a and the outer periphery contact portion 81b constitute the substrate contact portion 81.

As shown in FIG. 14A, the misalignment prevention mechanism 120 is provided near the outer periphery of the wafer holder 24. As shown in FIG. 14A, the recess 25 in which the wafer W is held in a contact manner is formed inside the wafer holder 24. The misalignment prevention mechanism 120 is provided around the recess 25. That is to say, the recess 25 is an area in which the wafer W is surely held by the misalignment prevention mechanism 120 and is an area included in the wafer holder 24. The wafer holder 24 includes the recess 25 recessed downward, and the misalignment prevention mechanism 120 is provided outside and below the recess 25.

Further, as shown in FIGS. 2, 3, 12 and 13, at least three misalignment prevention mechanisms 120 are provided, but the present disclosure is not limited thereto. Four or more misalignment prevention mechanisms 120 may be provided.

The mounting of the wafer W on the wafer holder 24 is performed using the lifting pins 16. Through-holes 28 are formed in the wafer holder 24 and the rotary table 2. The lifting pins 16 penetrate the through-holes 28 to deliver the wafer W to the wafer holder 24. The lifting pins 16 may be provided only at positions facing the transfer port 37 through which the wafer W is transferred. The lifting pins 16 are moved below the recess 25 of the wafer holder 24 so that the wafer W is mounted on the wafer holder 24.

When the wafer W is mounted on the wafer holder 24, the substrate misalignment prevention member 80 is closed due to the weight of the wafer W so that the substrate misalignment prevention member 80 is brought into contact with the wafer W. At this time, the spring 100 comes into a contracted state. The reception portion 84 is pulled downward by virtue of the elastic force of the spring 100, and the substrate misalignment preventing member 80 is closed and is brought into contact with the lateral surface of the wafer W.

The shape of the notch deviation prevention member 80a has been described in FIGS. 13A and 13B. The shape of the outer periphery deviation prevention member 80b is similar to that of the notch deviation prevention member 80a except that the notch locking portion 810 is omitted from the notch contact portion 81a of the notch deviation prevention member 80a. From the viewpoint of increasing the contact area with the wafer W and reliably holding the wafer W in a contact manner, the outer periphery deviation prevention member 80b may have a curved surface along the outer periphery of the wafer W rather than a flat surface.

The fixing part 110 is used to remove the wafer W. The fixing part 110 is disposed below the recess 25 when holding the wafer W.

FIG. 14A is a view showing a state in which the wafer W is removed from the misalignment prevention mechanism 120. As shown in FIG. 14A, the lifting pins 16 are moved upward to lift up the wafer W such that the wafer W is removed from the wafer holder 24. At this time, the fixing part 110 is also moved upward to push up the reception portion 84. The substrate misalignment prevention member 80 is rotated outward to open the substrate contact portion 81. The fixing part 110 pushes the reception portion 84 upward with a shoulder 111. As a result, the connection portion 83 is moved upward, and the rotating portion 82 rotates around the rotary shaft 90 to be opened outward. The fixing part 110, which is used as a countervailing force application member for applying a countervailing force against the elastic force of the spring 100, is moved upward against the elastic force of spring 100. Therefore, when the fixing part 110 is moved downward, the reception portion 84 is moved downward by virtue of the elastic force of the spring 100 so that the substrate misalignment prevention member 80 comes into a closed state.

In this manner, the fixing part 110 functions as a releasing member for releasing the holding of the wafer W by the substrate misalignment prevention member 80. Specifically, in a state where a biasing force contracting the spring 100 exerts on the connection portion 83 and the substrate misalignment prevention member 80 is closed to hold the wafer W, the connection portion 83 is pressed upward against the biasing force of the spring 100 and the spring 100 is expanded to move the connection portion 83 connected to the reception portion 84 upward. The upward movement of the connection portion 83 causes the rotating portion 82 to rotate outward. In this way, the holding of the wafer W is released. Thus, the wafer W can be moved in the vertical direction by moving the lifting pins 16 upward.

For example, by the operation as described above, the wafer W is mounted on or removed from the wafer holder 24. The wafer W can be fixed in a contact manner and removed in a simplified way using the weight of the wafer W and the elastic force of the spring 100.

The substrate misalignment prevention member 80 may be made of various materials. For example, on ground that the substrate misalignment prevention member 80 is exposed to an internal processing space of the vacuum container 11, the substrate misalignment prevention member 80 may be made of a material having little dust and high heat resistance. As an example, the substrate misalignment prevention member 80 may be made of quartz similarly to the rotary table 2 or may be made of a material such as ceramics having high heat resistance and little dust.

The spring 100 may be made of various materials ceramics. As described above, Inner members of the vacuum container 11 may be made of quartz or ceramics having little dust and high heat resistance. However, quartz has poor elasticity, which makes it difficult to form the spring 100. Thus, the spring 100 may be made of ceramics.

Further, the spring 100 may have various shapes depending on the intended use. For example, the spring 100 may be a leaf spring other than the helical spring shown in FIGS. 14A and 14B. When the spring 100 is the helical spring as shown in FIGS. 14A and 14B, contamination may occur due to contact between lines of the spring 100. Therefore, the spring 100 may use a leaf spring with a small number of parts. Accordingly, the spring 100 may be configured by a leaf spring.

FIG. 15 is a view showing another example of the notch locking portion 810 of the notch deviation prevention member 80a, which is different from that in FIGS. 12A to 13B. As shown in FIG. 15, the notch locking portion 810 may be shaped to be inserted into a rod-like notch T. The notch locking portion 810 may not be brought into complete engagement with the notch T as long as it can lock the notch T. Therefore, the notch locking portion 810 may not be shaped to completely conform to the shape of the notch T as long as it can be in contact with at least a portion of the notch T to prevent the deviation of the notch T. From such a viewpoint, the notch locking portion 810 may have a bar shape having a square or triangular section, or may have an inwardly-protruded shape to be in contact with a portion of the notch T. As described above, the notch locking portion 810 may have various shapes depending on the intended use as long as it can lock the notch T.

FIGS. 16A and 16B are views showing examples of the shape of the outer periphery deviation prevention member 80b. As shown in FIG. 16A, the outer periphery contact portion 81b of the outer periphery deviation prevention member 80b may have a curved shape in conformity to the curved periphery of the wafer W. Alternatively, the outer periphery contact portion 81b may be formed as a simple flat surface, as shown in FIG. 16B. As describe above, the outer periphery contact portion 81b of the outer periphery deviation prevention member 80b may have various shapes depending on the intended use as long as it can hold the outer peripheral surface of the wafer W in a contact manner.

Next, the operation of the misalignment prevention mechanism 120 will be described.

First, as shown in FIG. 14A, the lifting pins 16 are moved upward to receive the wafer W from a transfer arm (not shown). Thereafter, the lifting pins 16 are moved downward to be brought into the state as shown in FIG. 14B.

Specifically, as shown in FIG. 14A, first, the fixing part 110 presses the connection portion 83 upward such that the connection portion 83 and the reception portion 84 are moved upward. The substrate misalignment prevention member 80 whose inner end is connected to the outer end of the connection portion 83 rotates outward around the rotary shaft 90. The substrate contact portion 81 of the substrate misalignment prevention member 80 is opened. Thus, the wafer W is brought into a state where the wafer W can be mounted on the wafer holder 24.

Subsequently, as shown in FIG. 14B, the lifting pins 16 are moved downward of the wafer holder 24. The wafer W is mounted on the wafer holder 24 and the fixing part 110 is moved downward. As a result, the spring 100 is contracted so that the connection portion 83 and the reception portion 84 are moved downward. With the downward movement of the reception portion 84, the substrate misalignment prevention member 80 rotates inward around the rotary shaft 90 so that the substrate misalignment prevention member 80 is brought into contact with the lateral surface of the wafer W. At this time, the notch T of the wafer W is engaged with the notch locking portion 810 of the notch contact portion 81a, so that the notch locking portion 810 locks the notch T. The biasing force of the spring 100 always exerts on the substrate misalignment prevention member 80. Thus, the wafer W is reliably held on the recess 25, namely the wafer holder 24. With this configuration, even when the rotary table 2 is rotated and the wafer holder 24 is rotated about its own axis to process the wafer W, the notch deviation prevention member 80a reliably locks the notch T of the wafer W and the outer periphery deviation prevention member 80b disposed at the side opposite the notch deviation prevention member 80a also holds the wafer W in a contact manner. Thus, the wafer W is held on the recess 25 in a contact manner. The front surface of the wafer W is processed while continuing the revolution of the rotary table and the rotation of the wafer holder 24. The wafer W is held without misalignment while being in contact with the recess 25. Thus, there is no generation of particles due to rubbing of the back surface of the wafer W. Further, the substrate process (film forming process) can be performed with good in-plane uniformity by a combination of the rotation and the revolution.

Upon completing the process of the wafer W, the fixing part 110 pushes the reception portion 84 upward with the shoulder 111 to open the substrate misalignment prevention member 80. Subsequently, as shown in FIG. 14A, the lifting pins 16 are moved upward to lift up the wafer W while supporting the wafer W. Thereafter, a transfer arm (not shown) receives the wafer W and unloads the processed wafer W out of the vacuum container 11.

In this way, according to the misalignment prevention mechanism of the substrate processing apparatus according to the present embodiment, it is possible to perform the substrate process with good in-plane uniformity while preventing misalignment of the wafer W and performing the revolution of the rotary table 2 and the rotation of the wafer holder 24 without generating particles.

As shown in FIG. 1, the film forming apparatus 1 is provided with a controller 130 including a computer for controlling the overall operation of the apparatus. The controller 130 stores a program for executing operations related to a film forming process to be described later. The program transmits control signals to various parts of the film forming apparatus 1 to control the operations of the respective parts. Specifically, flow rates of respective processing gases to be supplied from the gas nozzles 61 to 65, a heating temperature of the wafer W by the heater 33, a flow rate of the $N_2$ gas to be supplied through the central region forming portion C, the number of revolutions per unit time of the rotary table 2 by the rotation driver for revolution 22, the rotational angle of the wafer holder 24 by the magnetic gear mechanism, and the like are controlled according to the control signals. The program includes a group of steps for performing the above control operations to execute various processes to be described later. The program is installed on the controller 130 from a storage medium such as a hard disk, a compact disc, a magneto-optical disk, a memory card, a flexible disk or the like.

[Substrate Processing Method]

Next, an example of a substrate processing method using the substrate processing apparatus according to the present embodiment will be described. First, the rotary table 2 is rotated to align the wafer holder 24 to the side of the transfer port 37. A gate valve (not shown) is opened. Subsequently, the wafer W is loaded into the vacuum container 11 via the transfer port 37 by a transfer arm (not shown). The wafer W is delivered on the lifting pins 16. The transfer arm (not shown) is withdrawn from the vacuum container 11. Thereafter, the wafer W is lifted down on the wafer holder 24 by the lifting pins 16 that are driven by an elevating mechanism (not shown). As described with reference to FIGS. 14A and 14B, the wafer W mounted on the wafer holder 24 is held in a contact manner by the misalignment prevention mechanism 120. A series of operations described above is repeated five times such that five wafers W are mounted on the respective wafer holders 24.

Subsequently, the interior of the vacuum container 11 is maintained at a preset pressure by a vacuum pump (not shown) and a pressure regulator (not shown). The rotary table 2 starts to rotate clockwise when viewed from the top. With the rotation of the rotary table 2, the rotation operation of the driving gear 51 disposed in the lower portion of the container body 13 also starts and the rotation of the wafer holder 24 also starts. The rotary table 2 is heated beforehand to a predetermined temperature (for example, 300 degrees C.) by the heater 33. The wafer W mounted on the rotary table 2 is also heated. If it is determined by a temperature sensor (not shown) that the heated wafer W is maintained at the predetermined temperature, a BTBAS gas is supplied from the raw material gas nozzle 61 into the adsorption region R1, and an $O_3$ gas is supplied from the oxidizing gas nozzle 63 into the oxidation region R2. Further, a plasma generating gas is supplied from the plasma generating gas nozzle 64 into the plasma processing region R3. A high frequency power is supplied from the high frequency power supply 76 to the antenna 75 to form plasma. In addition, an $N_2$ gas is supplied from the separation gas nozzles 62 and 65 into the respective separation regions D. Further, an $N_2$ gas is discharged from the central region forming portion C along the front surface of the rotary table 2.

When the wafer W passes through the adsorption region R1 defined below the raw material gas nozzle 61, BTBAS molecules are adsorbed onto the front surface of the wafer W. When the wafer W passes through the oxidation region R2 defined below the oxidizing gas nozzle 63, $O_3$ molecules are adsorbed onto the front surface of the wafer W such that the BTBAS molecules are oxidized by $O_3$. Therefore, if the wafer W passes through both the adsorption region R1 and the oxidation region R2 once with the rotation of the rotary table 2, one molecular layer (or two or more molecular layers) of silicon oxide is formed on the front surface of the wafer W. Further, when the wafer W passes through the plasma processing region R3 defined below the plasma generating gas nozzle 64, the wafer W is exposed to oxygen plasma and/or oxygen radicals such that the molecular layer of silicon oxide is modified by plasma.

In this manner, as the wafer W passes through the adsorption region R1, the oxidation region R2 and the plasma forming region R3 in this order plural times, a silicon oxide film having a predetermined film thickness is deposited on the front surface of the wafer W. At this time, the wafer W is held on the wafer holder 24 in a contact manner without misalignment by the misalignment prevention mechanism 120. Thus, no particles are generated from the back surface of the wafer W. and the entire front surface of the wafer W is subjected to a uniform substrate process (the film forming process).

After the silicon oxide film having a predetermined film thickness is deposited, the supply of the BTBAS gas and the $O_3$ gas is stopped, and the rotation of the rotary table 2 is stopped. At this time, the position of the notch T of the wafer W is the same as that at the time of the loading operation, and no misalignment occurs. In addition, since the substrate process is performed by rotating the rotary table 2 while rotating the wafer holder 24 about its own axis, it is possible to form a silicon oxide film on the front surface of each wafer W with high in-plane uniformity.

Thereafter, the processed wafers W are sequentially unloaded from the vacuum container 11 by the transfer arm (not shown) according to a sequence reverse to the loading operation, and the film forming process ends. The operation of unloading the wafer W is similar to that described with reference to FIGS. 14A and 14B.

As described above, with the substrate processing apparatus and the substrate processing method according to the present embodiment, it is possible to perform a high quality film forming process with high in-plane uniformity while reliably preventing misalignment of the wafer W in the wafer holder 24 by holding the wafer W at three points including the notch T in a contact manner.

Further, in the present embodiment, the example in which the wafer W with the notch T formed therein is processed has been described, but the present disclosure is not limited thereto. As an example, even for a wafer W in which an orientation flat is formed, the same effects can be achieved by using an orientation flat deviation prevention member capable of holding the orientation flat in a contact manner. In this case, for example, the orientation flat misalignment deviation member having the same shape as the outer periphery deviation prevention member 80b having the flat surface as shown in FIG. 16B, may be used to hold the orientation flat in a contact manner.

In the present embodiment, the example of forming the silicon oxide film has been described, but the present disclosure is not limited thereto. In some embodiments, a silicon nitride film may be formed by supplying a nitriding gas such as NH3 using the oxidizing gas nozzle 63 as a nitriding gas nozzle. In some embodiments, various kinds of raw material gases may be supplied from the raw material gas nozzle 61 depending on the type and the intended use of a film. In addition, the plasma generating gas nozzle 64 may supply another plasma generating gas adapted for the substrate process and activate the same under appropriate conditions, thus performing the modification process.

According to the present disclosure in some embodiments, it is possible to prevent a substrate from being misaligned inside a substrate holder.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   mounting at least one substrate on at least one substrate holder configured to rotate about an axis of the at least one substrate holder, the at least one substrate holder being provided along a circumferential direction of a rotary table installed inside a processing chamber;
   holding the at least one substrate by the at least one substrate holder in a contact manner by bringing a substrate contact portion into contact with at least three points on a lateral surface of the at least one substrate mounted on the at least one substrate holder; and
   performing a substrate process while rotating the rotary table and rotating the at least one substrate holder about the axis of the at least one substrate holder in a state where the at least one substrate is held by the at least one substrate holder in the contact manner,
   wherein one point of the at least three points includes a notch, and
   wherein, in the substrate contact portion, one portion to be brought into contact with the one point of the at least three points has a shape tailored to be entirely or partially engaged with the notch, or a rod shape tailored to be inserted into the notch.

2. The method of claim 1, wherein the other points of the at least three points are defined at a side opposite the notch in the lateral surface of the at least one substrate.

3. The method of claim 2, wherein the other portions to be brought into contact with the other points of the at least three points, have curved surfaces or flat surfaces along an outer periphery of the at least one substrate.

4. The method of claim 1, wherein the substrate contact portion is included in a misalignment prevention member configured to be rotatably supported in a vertical direction, and an elastic force for closing the substrate contact portion exerts on the misalignment prevention member,
   wherein the mounting at least one substrate on at least one substrate holder includes applying a countervailing force against the elastic force to the misalignment prevention member to open the substrate contact portion; and
   wherein the holding the at least one substrate by the at least one substrate holder includes bringing the substrate contact portion into contact with the at least one substrate by a weight of the substrate and the elastic force when the at least one substrate is mounted on the at least one substrate holder.

5. The method of claim 4, further comprising:
applying the countervailing force against the elastic force to the misalignment prevention member to open the substrate contact portion, that occurs after the performing a substrate process; and
removing the at least one substrate from the at least one substrate holder to unload the at least one substrate from the processing chamber.

6. The method of claim 1, wherein the holding the at least one substrate by the at least one substrate holder includes bringing the substrate contact portion into contact with the at least one substrate without applying a pressing force to the at least one substrate.

7. The method of claim 1, wherein the at least one substrate holder includes a plurality of substrate holders provided along the circumferential direction of the rotary table, and the at least one substrate includes a plurality of substrates, and
wherein the substrate process is performed by rotating the rotary table while rotating each of the plurality of substrate mounted on the plurality of substrate holders about an axis of each of the plurality of substrate holders.

8. The method of claim 1, wherein the substrate process includes a film forming process of alternately supplying, onto the at least one substrate, a raw material gas and a reaction gas reacting with the raw material gas to produce a reaction product, the film forming process being based on an atomic layer deposition.

\* \* \* \* \*